US010687296B2

(12) United States Patent
Sadiq et al.

(10) Patent No.: US 10,687,296 B2
(45) Date of Patent: Jun. 16, 2020

(54) TECHNIQUES FOR COMMUNICATING SYNCHRONIZATION SIGNAL BLOCK INDEX IN A PHYSICAL BROADCAST CHANNEL PAYLOAD

(71) Applicant: QUALCOMM Incorporated, San Diego, CA (US)

(72) Inventors: Bilal Sadiq, Basking Ridge, NJ (US); Juergen Cezanne, Ocean Township, NJ (US); Sundar Subramanian, Bridgewater, NJ (US); Muhammad Nazmul Islam, Edison, NJ (US); Navid Abedini, Raritan, NJ (US); Tao Luo, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 118 days.

(21) Appl. No.: 15/922,554

(22) Filed: Mar. 15, 2018

(65) Prior Publication Data
US 2018/0279243 A1  Sep. 27, 2018

Related U.S. Application Data

(60) Provisional application No. 62/476,703, filed on Mar. 24, 2017, provisional application No. 62/476,643, filed on Mar. 24, 2017.

(51) Int. Cl.
*H03M 13/00* (2006.01)
*H04L 27/06* (2006.01)
(Continued)

(52) U.S. Cl.
CPC ......... *H04W 56/003* (2013.01); *H04L 1/0054* (2013.01); *H04L 1/0056* (2013.01);
(Continued)

(58) Field of Classification Search
CPC . H04W 56/003; H04W 72/005; H04W 48/10; H04L 1/0054; H04L 1/0056;
(Continued)

(56) References Cited

U.S. PATENT DOCUMENTS 8,467,480 B2 * 6/2013 Liu ..................... H04L 1/08
375/340
10,291,260 B2 * 5/2019 Axmon ............... H03M 13/093
(Continued)

FOREIGN PATENT DOCUMENTS

WO    WO-2011032107 A1    3/2011
WO    WO-2016173922 A1    11/2016

OTHER PUBLICATIONS

Ericsson: "PBCH repetition for MTC", 3GPP DRAFT; R1-152190 PBCH repetition for MTC, 3rd Generation Partnership Project (3GPP), Mobile Competence Centre; 650, Route Des Lucioles; F-06921 Sophia-Antipolis Cedex; France, vol. RAN WG1, No. Belgrade, Serbia; Apr. 20, 2015-Apr. 24, 2015 Apr. 25, 2015 (Apr. 25, 2015), XP050950421, Retrieved from the Internet: URL:http://www.3gpp.org/ftp/tsg_ran/WG1_RL1/TSGR1_80b/Docs/ [retrieved on Apr. 25, 2015], 4 pages.
(Continued)

*Primary Examiner* — Edan Orgad
*Assistant Examiner* — Vanneilian Lalchinthang
(74) *Attorney, Agent, or Firm* — Holland & Hart LLP

(57) ABSTRACT

A user equipment (UE) receives a first synchronization signal (SS) block including a first codeword and a second SS block including a second codeword. Each codeword is based on a linear encoding of a physical broadcast channel (PBCH) payload. The PBCH payloads include different timing indicators. The SS blocks are received at different times separated by a time increment. The UE determines, based on the time increment, one or more hypotheses of
(Continued)

combined decoding metrics for the first codeword and the second codeword, and decodes the first codeword based on each of at least one hypothesis in the one or more hypotheses. The at least one hypothesis includes a correct hypothesis. The UE determines the first codeword based on an error detection procedure such as CRC verification performed when decoding the first codeword based on the correct hypothesis.

60 Claims, 16 Drawing Sheets

(51) Int. Cl.
| | |
|---|---|
| *H04W 56/00* | (2009.01) |
| *H04W 72/00* | (2009.01) |
| *H04L 5/00* | (2006.01) |
| *H04L 1/18* | (2006.01) |
| *H04L 1/00* | (2006.01) |
| *H04W 48/10* | (2009.01) |
| *H03M 13/09* | (2006.01) |
| *H03M 13/29* | (2006.01) |
| *H03M 13/23* | (2006.01) |
| *H03M 13/13* | (2006.01) |
| *H03M 13/15* | (2006.01) |

(52) U.S. Cl.
CPC .......... *H04L 1/1845* (2013.01); *H04L 5/0044* (2013.01); *H04L 5/0048* (2013.01); *H04L 5/0053* (2013.01); *H04W 56/001* (2013.01); *H04W 72/005* (2013.01); *H03M 13/09* (2013.01); *H03M 13/13* (2013.01); *H03M 13/136* (2013.01); *H03M 13/1505* (2013.01); *H03M 13/23* (2013.01); *H03M 13/2906* (2013.01); *H04W 48/10* (2013.01)

(58) Field of Classification Search
CPC ..... H04L 1/1845; H04L 1/189; H04L 1/0072; H04L 1/0061; H04L 1/08
USPC ........................................................ 370/329
See application file for complete search history.

(56) References Cited

U.S. PATENT DOCUMENTS

| | | | |
|---|---|---|---|
| 2007/0047499 A1* | 3/2007 | Montojo | H04L 1/0009 370/335 |
| 2009/0116470 A1* | 5/2009 | Berggren | H03M 13/33 370/342 |
| 2011/0026645 A1* | 2/2011 | Luo | H04L 1/0038 375/340 |
| 2016/0182187 A1* | 6/2016 | Kim | H03M 13/09 714/807 |
| 2018/0091173 A1* | 3/2018 | Axmon | H03M 13/4107 |
| 2018/0167946 A1* | 6/2018 | Si | H04L 1/0061 |
| 2018/0242231 A1* | 8/2018 | Reial | H04L 5/0053 |
| 2019/0007106 A1* | 1/2019 | Park | H04B 7/0426 |

OTHER PUBLICATIONS

International Search Report and Written Opinion—PCT/US2018/022907—ISA/EPO—dated Jun. 18, 2018.

* cited by examiner

TECHNIQUES FOR COMMUNICATING SYNCHRONIZATION SIGNAL BLOCK INDEX IN A PHYSICAL BROADCAST CHANNEL PAYLOAD

CROSS REFERENCES

The present application for patent claims priority to U.S. Provisional Patent Application No. 62/476,643 by Sadiq et al., entitled "Techniques For Communicating Synchronization Signal Block Index in a Physical Broadcast Channel Payload," filed Mar. 24, 2017, and to U.S. Provisional Patent Application No. 62/476,703 by Sadiq et al., entitled "Techniques For Communicating Synchronization Signal Block Index in a Physical Broadcast Channel Payload," filed Mar. 24, 2017. Both provisional applications are assigned to the assignee hereof.

BACKGROUND

Field of the Disclosure

The present disclosure, for example, relates to wireless communication systems, and more particularly to techniques for communicating a synchronization signal (SS) block index in a physical broadcast channel (PBCH) payload.

Description of Related Art

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

A wireless multiple-access communication system may include a number of base stations, each simultaneously supporting communication for multiple communication devices, otherwise known as user equipment or UEs. In a Long-Term Evolution (LTE) or LTE-Advanced (LTE-A) network, a set of one or more base stations may define an eNodeB (eNB). In a next generation, new radio (NR), millimeter wave (mmW), or 5G network, a base station may take the form of a smart radio head (or radio head (RH)) or access node controller (ANC), with a set of smart radio heads in communication with an ANC defining a gNodeB (gNB). A base station may communicate with a set of UEs on downlink channels (e.g., for transmissions from a base station to a user equipment (UE)) and uplink channels (e.g., for transmissions from a UE to a base station).

Wireless devices that operate in mmW frequency ranges, e.g., 28 GHz, 40 GHz, 60 GHz, etc., may be associated with increased signal attenuation (e.g., path loss), which may be influenced by various factors, such as temperature, barometric pressure, diffraction, etc. As a result, signal processing techniques, such as beamforming, may be used to coherently combine energy and overcome the path losses at these frequencies. In some cases, a base station may transmit signals on a broadcast channel by repetitively transmitting the signals while changing the beam on which the signals are transmitted (e.g., the base station may transmit the signals on each of a plurality of beams while performing a beam sweep). In some cases, a base station may repetitively transmit a group of signals defining a synchronization signal (SS) block. The signals transmitted within the SS block may include a primary synchronization signal (PSS), a secondary synchronization signal (SSS), and/or a physical broadcast channel (PBCH). These signals may be used by a UE for acquisition of a network, for example, or for other purposes. Conventional solutions for acquiring a network using SS blocks are deficient.

SUMMARY

The techniques described herein provide for communicating a synchronization signal (SS) block that includes a SS block index in a physical broadcast channel (PBCH) payload, and combining codewords received in different SS blocks to enable a user equipment (UE) to synchronize and acquire a network. In an example, when a base station transmits a plurality of SS blocks carrying duplicative signals on different beams (or on a same beam, but at different times), and a UE receives one of the SS blocks, the UE may determine the timing of the SS block with respect to a slot boundary, subframe boundary, frame boundary, or some other timing reference, to enable the UE to synchronize with the base station. In some examples, the timing of the SS block may be determined based at least in part on a SS block index, which may convey the location of the SS block within a sequence of SS blocks. The present disclosure describes techniques for communicating a SS block index in a PBCH payload in a SS block. Because the inclusion of a SS block index in a PBCH payload causes the PBCH payload of a SS block to change from one SS block to another SS block, the present disclosure describes techniques for combining codewords received in different SS blocks, despite the codewords possibly being based on PBCH payloads having different content. The present disclosure also describes techniques for identifying SS blocks that have a known timing relationship and hence contain codewords that can be combined according to a hypothesis from a smaller subset of all possible combining hypotheses, where the smaller subset includes only hypotheses corresponding to the SS blocks that have the known timing relationship.

In one example, a method for wireless communication at a UE is described. The method may include receiving, in a first SS block, a first codeword based at least in part on a linear encoding of a first PBCH payload, the first PBCH payload including a first timing indicator for the first SS block; receiving, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment; determining, based at least in part on the time increment, one or more hypotheses of combined decoding metrics for the first codeword and the second codeword; decoding the first codeword based on each of at least one hypothesis in the one or more hypotheses, the at least one hypothesis including a correct hypothesis; and determining the first codeword based at least in part on a cyclic redundancy check (CRC) verification performed when decoding the first codeword based at least in part on the correct hypothesis.

In one example, an apparatus for wireless communication at a UE is described. The apparatus may include a processor, memory in electronic communication with the processor, and instructions stored in the memory. The instructions may be executable by the processor to receive, in a first SS block, a first codeword based at least in part on a linear encoding of a first PBCH payload, the first PBCH payload including a first timing indicator for the first SS block; receive, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment; determine, based at least in part on the time increment, one or more hypotheses of combined decoding metrics for the first codeword and the second codeword; decode the first codeword based on each of at least one hypothesis in the one or more hypotheses, the at least one hypothesis including a correct hypothesis; and determine the first codeword based at least in part on a CRC verification performed when decoding the first codeword based at least in part on the correct hypothesis.

In one example, another apparatus for wireless communication at a UE is described. The apparatus may include means for receiving, in a first SS block, a first codeword based at least in part on a linear encoding of a first PBCH payload, the first PBCH payload including a first timing indicator for the first SS block; means for receiving, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment; means for determining, based at least in part on the time increment, one or more hypotheses of combined decoding metrics for the first codeword and the second codeword; means for decoding the first codeword based on each of at least one hypothesis in the one or more hypotheses, the at least one hypothesis including a correct hypothesis; and means for determining the first codeword based at least in part on a CRC verification performed when decoding the first codeword based at least in part on the correct hypothesis.

In one example, a non-transitory computer-readable medium storing computer-executable code for wireless communication at a UE is described. The code may be executable by a processor to receive, in a first SS block, a first codeword based at least in part on a linear encoding of a first PBCH payload, the first PBCH payload including a first timing indicator for the first SS block; receive, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment; determine, based at least in part on the time increment, one or more hypotheses of combined decoding metrics for the first codeword and the second codeword; decode the first codeword based on each of at least one hypothesis in the one or more hypotheses, the at least one hypothesis including a correct hypothesis; and determine the first codeword based at least in part on a CRC verification performed when decoding the first codeword based at least in part on the correct hypothesis.

In some examples of the method, apparatus, and non-transitory computer-readable medium described above, determining the one or more hypotheses may include determining, based at least in part on the time increment, a first intermediate one or more hypotheses for a bit difference between the first timing indicator and the second timing indicator; and determining the one or more hypotheses of combined decoding metrics for the first codeword and the second codeword based at least in part on the first intermediate one or more hypotheses. In some examples of the method, apparatus, and non-transitory computer-readable medium described above, determining the one or more hypotheses of combined decoding metrics for the first codeword and the second codeword based at least in part on the first intermediate one or more hypotheses may further include determining, based at least in part on the first intermediate one or more hypotheses, a second intermediate one or more hypotheses for an encoded bit difference between the first codeword and the second codeword; correcting a second set of decoding metrics for the second codeword based at least in part on at least one of the second intermediate one or more hypotheses; and combining each corrected second set of decoding metrics with a first set of decoding metrics for the first codeword, to determine the one or more hypotheses of combined decoding metrics for the first codeword and the second codeword.

In some examples of the method, apparatus, and non-transitory computer-readable medium described above, the combined decoding metrics comprise log-likelihood ratios (LLRs).

In some examples of the method, apparatus, and non-transitory computer-readable medium described above, the first timing indicator may include a first SS block index, for the first SS block or a portion of the first SS block index, and the second timing indicator may include a second SS block index, for the second SS block or a portion of the second SS block index. Some examples of the method, apparatus, and non-transitory computer-readable medium may further include processes, features, means, or instructions for determining a first timing of the first SS block within a broadcast channel transmission time interval (BCH TTI), based at least in part on the first SS block index. Some examples of the method, apparatus, and non-transitory computer-readable medium may further include processes, features, means, or instructions for identifying, based at least in part on the first SS block index, a beam on which the first SS block is transmitted.

In some examples of the method, apparatus, and non-transitory computer-readable medium described above, the first codeword may include the first PBCH payload encoded based at least in part on a first linear encoding, with the encoded first PBCH payload and a first CRC for the encoded first PBCH payload encoded based at least in part on a second linear encoding; and the second codeword comprises the second PBCH payload encoded based at least in part on the first linear encoding, with the encoded second PBCH payload and a second CRC for the encoded second PBCH payload encoded based at least in part on the second linear encoding.

In some examples of the method, apparatus, and non-transitory computer-readable medium described above, the first codeword may be received before the second codeword. In some examples, the second codeword may be received before the first codeword. In some examples, the first timing indicator and the second timing indicator may each include a same number of bits. In some examples, the first timing indicator and the second timing indicator may be from a predetermined set of timing indicators. In some examples, the time increment may include a number of SS blocks. In some examples, the first PBCH payload and the second PBCH payload may each include a same master information block (MIB). In some examples, the first SS block and the second SS block may be received within a BCH TTI. In some examples, the first SS block and the second SS block may be received within different BCH TTIs. In some examples, the first SS block and the second SS block may each include: a PSS, a SSS, or a combination thereof.

In one example, a method for wireless communication at a base station is described. The method may include allocating resources for a plurality of SS blocks; transmitting, in a first SS block that is separated in time from a second SS block burst by a time gap, a first codeword based at least in part on a linear encoding of a first PBCH payload, the first PBCH payload including a first timing indicator for the first SS block; and transmitting, in a second SS block separated in time from the first SS block by an inter-block time duration that includes a time increment, a second codeword based at least in part on a linear encoding of a second PBCH payload, the second PBCH payload including a second timing indicator for the second SS block, the second timing indicator based at least in part on the first timing indicator and the time increment.

In one example, an apparatus for wireless communication at a base station is described. The apparatus may include a processor, memory in electronic communication with the processor, and instructions stored in the memory. The instructions may be executable by the processor to allocate resources for a plurality of SS blocks; transmit, in a first SS block, a first codeword based at least in part on a linear encoding of a first PBCH payload, the first PBCH payload including a first timing indicator for the first SS block; and transmit, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment.

In one example, an apparatus for wireless communication at a base station is described. The apparatus may include means for allocating resources for a plurality of SS blocks; means for transmitting, in a first SS block, a first codeword based at least in part on a linear encoding of a first PBCH payload, the first PBCH payload including a first timing indicator for the first SS block; and means for transmitting, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment.

In one example, a non-transitory computer-readable medium storing computer-executable code for wireless communication at a base station is described. The code may be executable by a processor to allocate resources for a plurality of SS blocks; transmit, in a first SS block, a first codeword based at least in part on a linear encoding of a first PBCH payload, the first PBCH payload including a first timing indicator for the first SS block; and transmit, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment.

In some examples of the method, apparatus, and non-transitory computer-readable medium described above, the second SS block is transmitted in the first SS block burst, and the inter-block time duration is equal to the time increment. In some examples, the second SS block is transmitted in the second SS block burst, and the inter-block time duration includes the time gap.

Some examples of the method, apparatus, and non-transitory computer-readable medium described above may further include processes, features, means, or instructions for transmitting, in a third SS block, a third codeword based at least in part on a linear encoding of a third PBCH payload, and the third SS block is not separated in time from any other SS block by the inter-block time duration.

In some examples, the first timing indicator may include a first SS block index, for the first SS block or a portion of the first SS block index, and the second timing indicator comprises a second SS block index, for the second SS block or a portion of the second SS block index. In some examples, the first SS block index may identify a first timing of the first SS block within a BCH TTI, and the second SS block index may identify a second timing of the second SS block within the BCH TTI. In some examples, the first SS block index may identify a first beam on which the first SS block is transmitted, and the second SS block index may identify a second beam on which the second SS block is transmitted.

Some examples of the method, apparatus, and non-transitory computer-readable medium described above may further include processes, features, means, or instructions for encoding the first PBCH payload based at least in part on a first linear encoding; determining a first CRC for the encoded first PBCH payload; determining the first codeword by encoding the encoded first PBCH payload and the first CRC based at least in part on a second linear encoding; encoding the second PBCH payload based at least in part on the first linear encoding; determining a second CRC for the encoded second PBCH payload; and determining the second codeword by encoding the encoded second PBCH payload and the second CRC based at least in part on the second linear encoding.

In some examples of the method, apparatus, and non-transitory computer-readable medium described above, the first timing indicator and the second timing indicator may each include a same number of bits.

Some examples of the method, apparatus, and non-transitory computer-readable medium described above may further include processes, features, means, or instructions for selecting the first timing indicator and the second timing indicator from a predetermined set of timing indicators.

In some examples of the method, apparatus, and non-transitory computer-readable medium described above, the time increment may include a number of SS blocks. In some examples, the first PBCH payload and the second PBCH payload may each include a same MIB. In some examples, the resources allocated for the plurality of SS blocks may be within a BCH TTI. In some examples, the resources allocated for the plurality of SS blocks may be within different BCH TTIs. In some examples, the first SS block and the second SS block may each include: a PSS, a SSS, or a combination thereof.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
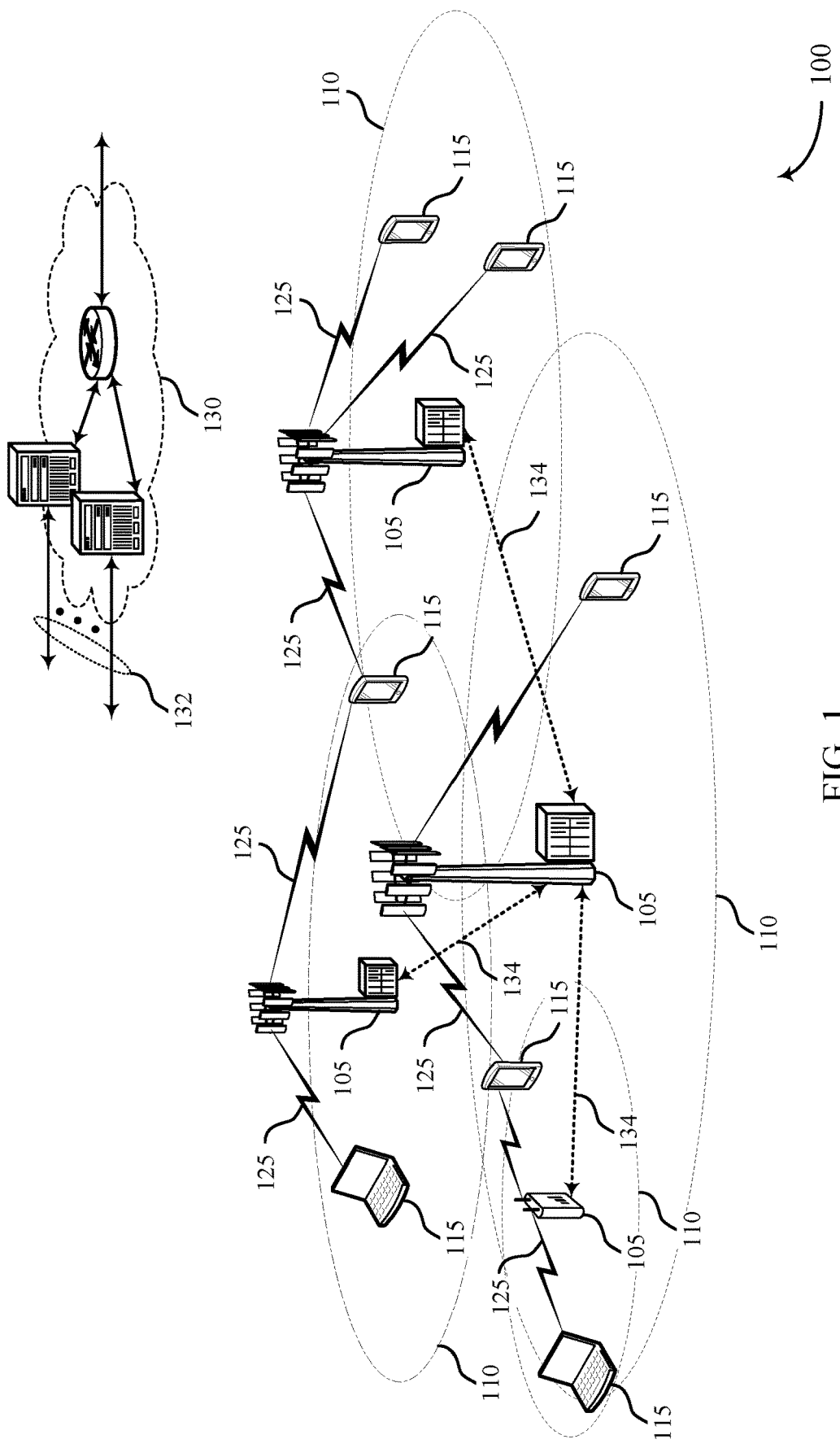
FIG. 1 shows an example of a wireless communication system, in accordance with various aspects of the present disclosure.

The techniques described herein provide for communicating a synchronization signal (SS) block that includes a synchronization signal SS block index in a physical broadcast channel (PBCH) payload, and combining codewords received in different SS blocks to enable a user equipment (UE) to synchronize and acquire a network. In an example, when a base station transmits a plurality of SS blocks carrying duplicative signals on different beams (or on a same beam, but at different times), and a UE receives one of the SS blocks, the UE may determine the timing of the SS block with respect to a slot boundary, subframe boundary, frame boundary, or some other timing reference, to enable the UE to synchronize with the base station. In some examples, the timing of the SS block may be determined based on a SS block index, which may convey the location of the SS block within a sequence of SS blocks. The inclusion of a SS block index in a PBCH payload causes the PBCH payload of a SS block to change from one SS block to another SS block, and the present disclosure provides techniques for combining codewords received in different SS blocks, despite the codewords possibly being based on PBCH payloads having different content. The present disclosure also describes techniques for identifying SS blocks that have a known timing relationship and hence contain codewords that can be combined according to a hypothesis from a smaller subset of all possible combining hypotheses, where the subset includes only hypotheses corresponding to the SS blocks that have the known timing relationship.

A wireless communication system (e.g., a mmW system) may utilize directional or beamformed transmissions (e.g., beams) for communication. For example, a base station may transmit signals on multiple beams associated with different directions. In some cases, the base station may engage in beam sweeping over a portion (or all) of the possible beams for transmitting messages or signals intended for UEs distributed throughout a coverage area of the base station. For example, a base station may transmit multiple instances of a SS block, on different beams, during a periodic broadcast channel transmission time interval (BCH TTI). In some cases, a base station may transmit multiple instances of a SS block on a same beam, or in an omnidirectional manner. A UE that receives one of the SS blocks may acquire a network associated with the base station. However, before or while acquiring the network, the UE may determine the timing of one or more SS blocks that it receives. In some cases, the timing of a SS block may be determined based on a SS block index that conveys the timing of the SS block within a sequence of SS blocks.

Techniques described in the present disclosure communicate a SS block index in a PBCH payload in a SS block, and enable codewords received in different SS blocks to be combined, despite the codewords possibly being based on PBCH payloads having different content. In some examples, a UE may identify SS blocks that do, and do not, have a specific inter-block time duration. The SS blocks that have the specific inter-block time duration include codewords that may be combined, whereas the SS blocks that do not have the specific inter-block time duration may be discarded as a misdetection and not combined. Beneficially, the UE may reduce the number of hypotheses to only include hypotheses corresponding to SS blocks that are combinable by identifying the SS blocks that are separated by the specific inter-block time duration.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various operations may be added, omitted, or combined. Also, features described with respect to some examples may be combined in some other examples.

FIG. 1 shows an example of a wireless communication system 100, in accordance with various aspects of the present disclosure. The wireless communication system 100 includes base stations 105, UEs 115, and a core network 130. In some examples, the wireless communication system 100 may be a Long Term Evolution (LTE), LTE-Advanced (LTE-A) network, or a New Radio (NR) network. In some cases, wireless communication system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communication system 100 may include uplink (UL) transmissions from a UE 115 to a base station 105, or downlink (DL) transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a TTI of a downlink channel may be distributed between different control regions in a cascaded manner (e.g., between a common control region and one or more UE-specific control regions).

UEs 115 may be dispersed throughout the wireless communication system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the geographic coverage area 110 of a cell. Other UEs 115 in such a group may be outside the geographic coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communication system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) or gNodeBs (gNBs).

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS).

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

At times, a UE 115 may perform an initial access (acquisition) procedure with a base station 105, synchronize with a base station 105, or measure signals transmitted by a base station 105. When performing the initial access procedure (or synchronizing, or performing measurements), the UE 115 may search a wireless spectrum for a SS block transmitted by the base station 105. The SS block may include information usable by the UE 115 to synchronize the UE 115 with the base station 105, so that the UE 115 may communicate with the base station 105 (or over a network to which the base station 105 provides access). After synchronizing with the base station 105, the UE 115 may initiate a random access procedure with the base station 105 by transmitting a random access preamble to the base station 105.

Figure 2:
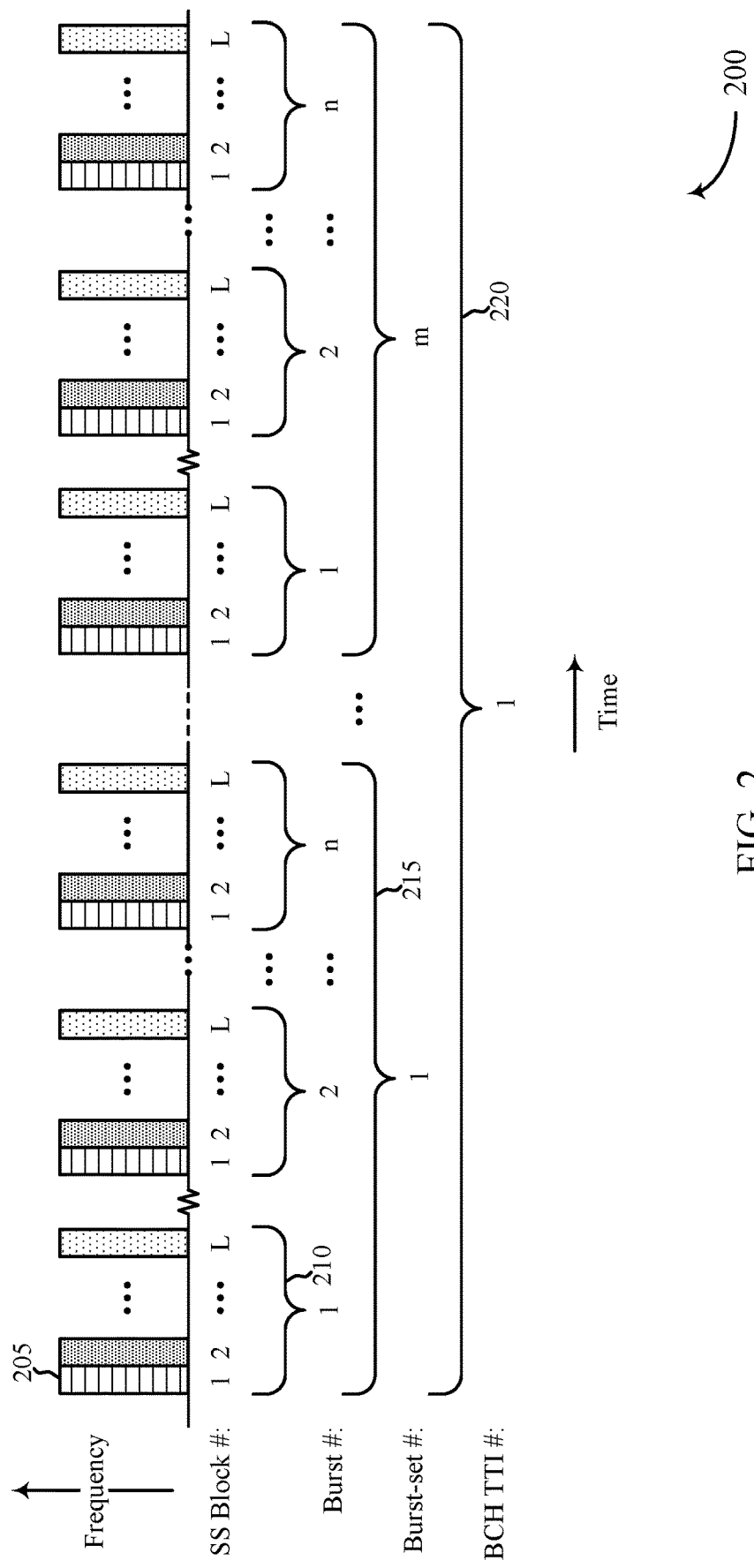
FIG. 2 shows an example timeline of SS blocks within a periodic BCH TTI, in accordance with various aspects of the present disclosure.

FIG. 2 shows an example timeline 200 of SS blocks 205 within a periodic BCH TTI, in accordance with various aspects of the present disclosure. The SS blocks 205 may be transmitted by a base station, which base station may be an example of aspects of one or more of the base stations 105 described with reference to FIG. 1. A UE may receive one or more of the SS blocks 205. The UE may be an example of aspects of one or more of the UEs 115 described with reference to FIG. 1.

The SS blocks 205 may include a plurality of SS blocks 205 transmitted in succession during a SS block burst 210. A SS block burst 210 may include L SS blocks 205. In some examples, the SS blocks 205 within a SS block burst 210 may be transmitted on different beams using a beam sweep. In other examples, the SS blocks 205 within a SS block burst 210 may be transmitted on a same beam, or in an omnidirectional manner. In some examples, a SS block 205 may include a PBCH and one or more of a PSS and a SSS. The payload of the PBCH may include a SS block index or other timing information. A SS block index may indicate a timing of a SS block 205 within a sequence of SS blocks 205 (e.g., a timing of a SS block 205 within a SS block burst 210). A SS block index may thus also indicate a timing of a SS block 205 within a SS block burst-set 215 and within a BCH TTI 220 (although in some cases, other timing information may need to be combined with the timing indicated by a SS block index to fully determine a timing of a SS block 205 within a SS block burst-set 215 or BCH TTI 220). In some examples, a SS block index may also indicate a beam on which a SS block 205 is transmitted. In some examples, the SSS of a SS block 205 may be based at least in part on a physical cell identity (PCI) of the base station that transmitted the SS block 205.

A plurality of SS blocks bursts 210 may be transmitted within a SS block burst-set 215. In some examples, the SS block bursts 210 in a SS block burst-set 215 may be associated with different PBCH redundancy versions (RVs). In some cases, a SS block burst-set 215 may include n SS block bursts 210. The SS block bursts 210 within a SS block burst-set 215 may be separated in time.

A plurality of SS block burst-sets 215 may be transmitted within the BCH TTI 220. For purposes of this disclosure, a BCH TTI is defined to include any time interval in which a plurality of SS blocks are transmitted with the same system information, regardless of whether the SS blocks are allocated to SS block bursts 210 or SS block burst-sets 215. In some examples, the SS block burst-sets 215 in a BCH TTI 220 may be associated with different SSSs. In some cases, a BCH TTI 220 may include m SS block burst-sets 215.

When m=2, n=4, and L=14, the number of SS blocks 205 transmitted within the BCH TTI 220 may be 112 (e.g., m·n·L=112). In other examples, the values of m, n, and L may be higher or lower. Regardless, a UE that receives one of the SS blocks 205 may need to determine the timing of the SS block 205 within a SS block burst 210, a SS block burst-set 215, and/or a BCH TTI 220.

Figure 3:
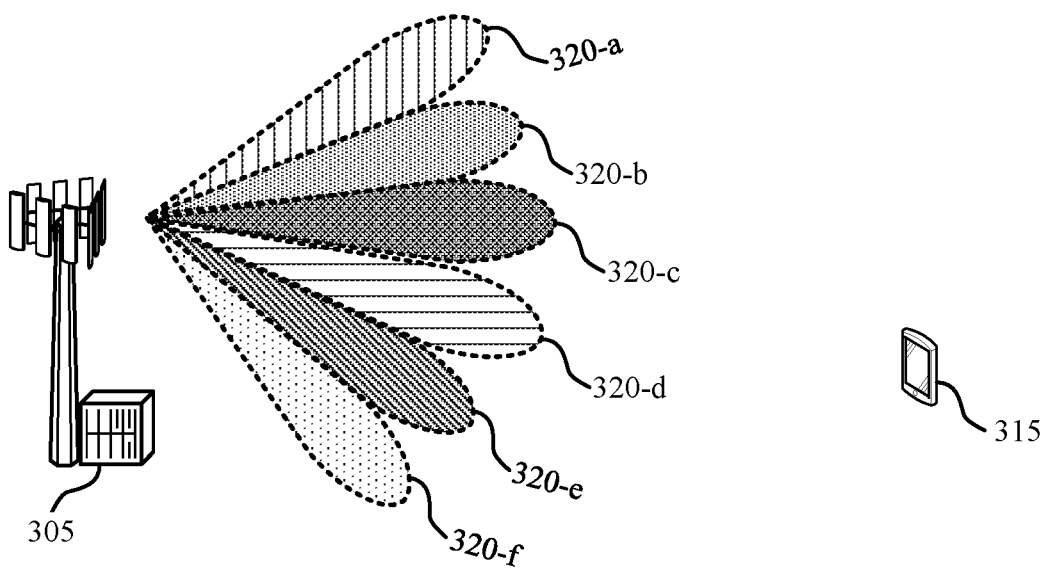
FIG. 3 shows an example of a mmW wireless communication system, in accordance with various aspects of the present disclosure.

FIG. 3 shows an example of a mmW wireless communication system 300, in accordance with various aspects of the present disclosure. The mmW wireless communication system 300 may include a base station 305 and a UE 315, which may be examples of aspects of one or more of the base stations 105 or UEs 115 described with reference to FIG. 1.

To overcome signal attenuation and path losses at mmW frequencies, the base station 305 and UE 315 may communicate with one another on one or more beams (i.e., directional beams). As shown, the base station 305 may transmit signals on a plurality of beams 320 (e.g., on different directional beams 320, including, for example, a first beam 320-*a*, a second beam 320-*b*, a third beam 320-*c*, a fourth beam 320-*d*, a fifth beam 320-*e*, and a sixth beam 320-*f*). In other examples, the base station 305 may transmit on more or fewer beams 320.

In some examples, the base station 305 may transmit a SS block on each of the beams 320, and the UE 315 may receive the SS block on one or more of the beams 320. The UE 315 may determine the timing of a SS block, and a beam 320 on which the SS block is received, to acquire a network to which the base station 305 provides access. In some examples, the UE 315 may determine the timing of the SS block and/or identify the beam 320 on which the SS block is received after receiving and combining decoding metrics for two or more SS blocks.

A base station may identify SS blocks using a known sequence of SS block indices. For example, let $l \in L \equiv \{0, \ldots, l_{max}-1\}$ denote a sequence of SS block indices, where $l_{max}$ is the total number of SS blocks represented in the sequence. In some examples, $l_{max}=64$. Now let $c(l)=Gb(l)$ denote a codeword carrying a PBCH payload in SS block index l (i.e., in ssIdx l), where b(l) is the PBCH payload in ssIdx l and contains l. In some examples, l may be carried in the least significant bits (LSBs) of the PBCH payload (e.g., in 6 LSBs). The remainder of the PBCH payload may carry a same MIB that is carried in the PBCH payloads of other SS blocks within a BCH TTI. G may represent a linear encoding of the PBCH payload b(l), in which $G=G_{code}G_{CRC}$ (i.e., a CRC attach followed by code generating matrix). The "code" may be any linear code, such as a polar code, or a Reed-Mueller code, or a Golay code, or a tail-biting convolutional code (TBCC). Also, the CRC may be replaced with any other linear or affine error detection code, such as an error detection code based on hashed bits, or parity bits, or frozen bits of a code, or the like, or any combination thereof. The base station may encode a first PBCH payload based at least in part on a first linear encoding, and determine a first cyclic redundancy check (CRC) for the encoded first PBCH payload. The base station may determine the first codeword by encoding the encoded first PBCH payload and the first CRC based at least in part on a second linear encoding, and generate a signal to transmit the codeword via a wireless channel. The UE may receive the signal via the wireless channel and determine whether a codeword decoded from the signal may be used to generate the same CRC code. If the same, the UE determines that the codeword passed CRC verification.

When two SS blocks carry codewords in which their PBCH payloads include different SS block indices (e.g., $l_1$ and $l_2$), a UE may need to determine an encoded bit difference between the codewords before it can combine decoding metrics for the codewords. In some examples, the UE may determine the encoded bit difference based on one or more hypotheses of combined decoding metrics for the codewords, which one or more hypotheses may be based at least in part on a known time increment between receipt of the codewords (i.e., between receipt of a first codeword in a first SS block and a second codeword in a second SS block, which may be in the same SS block burst or in a different SS block burst). The order in which the first codeword and second codeword are received is immaterial, and thus the first codeword may be received before the second codeword, or the second codeword may be received before the first codeword.

The bit difference in a first codeword in a first SS block and a second codeword in a second SS block may be denoted $\delta(\{l_1, l_2\}) = b(l_1) \oplus b(l_2)$. When a UE does not know $l_1$ or $l_2$, the UE may form a number of hypotheses for $l_1$ and $l_2$, as described, for example, with reference to FIGS. 4 and 5. The hypotheses may be selected from a set B, where $B = \{\delta(\{l_1, l_2\}): \{l_1, l_2\} \subset L\}$, where $|B| = l_{max}$ (e.g., 64), even though there are $$\binom{l_{max}}{2}$$

hypotheses $\{l_1, l_2\}$.

When the first codeword and second codeword are in first and second SS blocks separated by a known time increment $\Delta t$, with $\Delta t$ being expressed in units of SS blocks, the UE may determine, for all $l \in L$ such that $(l+\Delta t) \in L$, a first intermediate one or more hypotheses for a bit difference, $\delta(\{l, l+\Delta t\})$, between $l$ and $l+\Delta t$. The UE may then determine, based at least in part on the first intermediate one or more hypotheses, a second intermediate one or more hypotheses for an encoded bit difference between the first codeword and the second codeword. The encoded bit difference may be determined as $G \cdot \delta(\{l, l+\Delta t\})$ for all $l \in L$ such that $(l+\Delta t) \in L$. In some examples, $d(\delta) = G\delta$ may be determined offline for all $\delta \in B$, and $G \cdot \delta(\{l, l+\Delta t\})$ may be read from memory.

Based at least in part on at least one of the second intermediate one or more hypotheses, a set of decoding metrics for the second codeword may be corrected. For examples, LLRs for the second codeword (e.g., LLRs($l+\Delta t$)) may be corrected based on $G \cdot \delta(\{l, l+\Delta t\})$ for all $l \in L$ such that $(l+\Delta t) \in L$. The corrected decoding metrics for the second codeword may then be combined with decoding metrics for the first codeword for all $l \in L$ such that $(l+\Delta t) \in L$, to provide one or more hypotheses of combined decoding metrics for the first codeword and the second codeword. The decoding metrics can be combined because of the linearity of G—i.e., $G(b \oplus \delta) = Gb \oplus G\delta$, and thus:

$$c(l + \Delta t) = Gb(l + \Delta t) = G \cdot [b(l) \oplus \delta(\{l, l + \Delta t\})]$$
$$= Gb(l) \oplus G\delta(\{l, l + \Delta t\})$$
$$= c(l) \oplus d(\delta(\{l, l + \Delta t\}))$$
$$\Rightarrow c(l) = c(l + \Delta t) \oplus d(\delta(\{l, l + \Delta t\}))$$

where $d(\delta(\{l, l+\Delta t\}))$ may be determined offline and read from memory.

The first codeword may be decoded based on each of at least one hypothesis in the one or more hypotheses of combined decoding metrics for the first codeword and the second codeword. One of the hypotheses will be a correct hypothesis. The correct hypothesis, and the first codeword, may be determined based at least in part on a CRC verification performed when decoding the first codeword based at least in part on the correct hypothesis. In some examples, the CRC verification may be replaced with any other linear or affine error detection scheme, such as an error detection scheme based on hashed bits, or parity bits, or frozen bits of a code, or the like, or any combination thereof. The SS block index $l$ may be obtained from the first PBCH payload of the first SS block after correctly decoding the first codeword.

Thus, if the first codeword and the second codeword transmitted/received in SS blocks $l$ and $l+\Delta t$ are related, one codeword can be derived from the other if the time separation $\Delta t$ between the codewords is known. In other words, one codeword can be seen as a scrambled version of the other codeword, where the scrambling is given by $G\delta(\{l, l+\Delta t\})$. Because a UE that receives SS blocks $l$ and $l+\Delta t$ already knows $\Delta t$ (i.e., how far apart in time the UE detected the two SS blocks), the UE may combine decoding metrics such as LLRs for the two codewords and improve decoding performance.

The worst case number of hypotheses is $l_{max} - 1$ (e.g., 63) when $\Delta t = 1$, but the number of blind decodes that a UE performs may be $\ll L - 1$ (e.g., 6) because $\delta(\{l, l+\Delta t\}) = 1$ for all $l \in \{0, 2, 4, \ldots\}$. Further thinning (e.g., reduction) of hypotheses may occur if all $l_{max}$ SS blocks are not consecutive.

Figure 4:
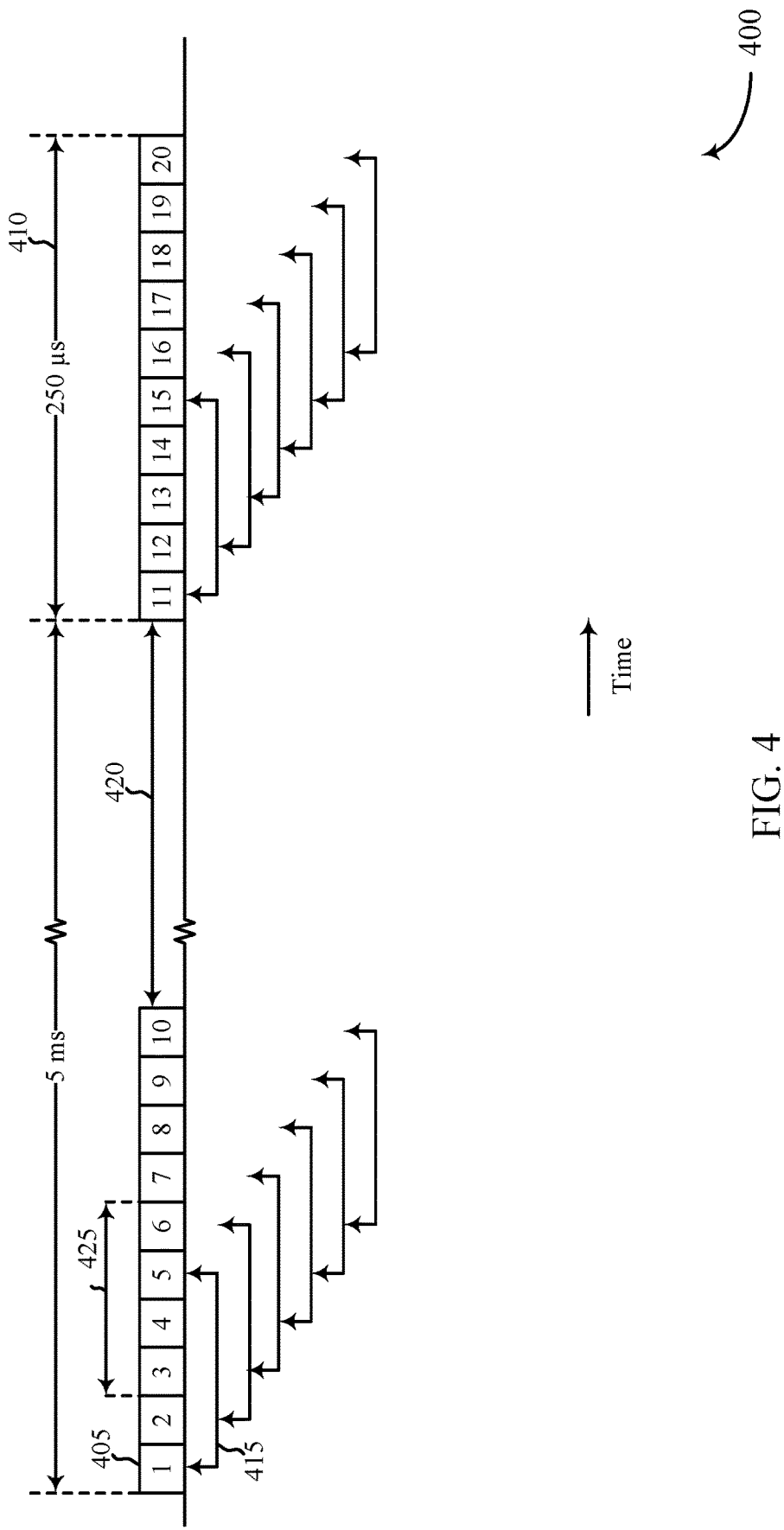
FIGS. 4-5 show example timelines of SS blocks, and possible identities of first and second SS block received by a UE at times separated by a known time increment, in accordance with various aspects of the present disclosure.

The set of hypotheses for $l_1$ and $l_2$ (or for $l$ and $l+\Delta t$) may depend on a particular configuration of SS blocks, such as the distribution of SS blocks between SS block bursts and SS block burst-sets. FIG. 4 indicates hypotheses for $l$ and $l+\Delta t$ when $\Delta t = 4$ SS blocks, and FIG. 5 indicates hypotheses for $l$ and $l+\Delta t$ when $\Delta t = 13$ SS blocks. As described below in more detail with respect to FIGS. 4-5, the set of hypotheses may be reduced if an inter-block time duration between SS blocks is nonuniform. Any hypotheses in the set of hypotheses may be discarded where a pair of SS blocks are not separated by the inter-block time duration, as described in further detail below. The inter-block time duration between two related SS blocks may be shorter or longer than the duration of an SS block burst; e.g., an inter-block time duration may correspond to a time increment and may optionally also include a duration of an intervening time gap between two SS block bursts.

In some examples, a nonuniform inter-block time duration may permit the UE 115 to consider hypotheses where SS blocks occur in a same SS burst. FIG. 4 shows an example timeline 400 of SS blocks 405, and possible identities of first and second SS blocks received by a UE at times separated by a known time increment, in accordance with various aspects of the present disclosure. By way of example, the SS blocks 405 are distributed over two SS block bursts 410, with each SS block burst 410 including ten SS blocks 405. The SS block bursts 410 may have a periodicity of, for example, 5 milliseconds (ms), with each SS block burst 410 spanning, for example, 250 microseconds (μs). SS block bursts 410 are separated in time by time gap 420. In some examples, time gap 420 is a multiple of a time duration of a single SS block 405. In the example of FIG. 4, the time duration of SS block 405 is 25 μs (i.e., the 250 μs periodicity divided into ten SS blocks of equal duration). In an example, time gap 420 is equal to the periodicity (5 ms) minus the duration of ten SS blocks (250 μs). The SS blocks 405 may be transmitted by a base station, such as base station 105 or 306 described with reference to FIGS. 1 and 3. A UE may receive one or more of the SS blocks 405. The UE may be an example of aspects of one or more of the UEs described with reference to FIGS. 1 and 3.

FIG. 4 assumes that the known time increment separating the first and second detected SS blocks is four SS blocks (e.g., Δt=4 SS blocks). Since the known time increment is shorter than the duration of the SS block burst 410, the inter-block time duration is also four SS blocks. Given the known time increment, and assuming that the SS blocks are transmitted in the pattern illustrated in FIG. 4, the UE may identify twelve hypotheses 415 for the identities of the first and second SS blocks and their respective locations within a sequence of SS blocks (e.g., l∈{1, 2, . . . , 6}∪{11, 12, . . . , 16} in pair {l, l+4}).

By way of example, the time increment is based on a number of SS blocks and the inter-block time duration in this example is the time increment 425. In this example, all possible valid hypotheses occur within a same SS block burst 410, and any possible hypotheses where a particular candidate SS block pair is separated by the time gap 420 are discarded. As a result, the inter-block time duration is the same as the time increment 425 since related SS blocks must occur within the same SS block burst 410. Thus, hypotheses corresponding to SS block pairs 7 and 11, 8 and 12, 9 and 13, and 10 and 14 are not included in the set of hypotheses because, due to nonuniformity introduced through time gap 420, these SS blocks are not separated by time increment 425 (e.g., by the same inter-block time duration).

That is, the inter-block time duration between blocks 7 and 11 includes time gap 420, thereby breaking the timing pattern relative to the pattern established for blocks 1 and 5, 2 and 6, etc. By knowing that, to be considered a valid hypothesis, the SS blocks must be separated by the inter-block time duration (e.g., separated by a time duration corresponding to 4 SS blocks), the UE 115 may eliminate hypotheses corresponding to an SS block that is not separated by the inter-block time duration 425 from any other SS block. Hence, the UE 115 may discard hypotheses corresponding to SS block pairs 7 and 11, 8 and 12, 9 and 13, and 10 and 14, thereby enabling the UE to reduce the number of hypotheses considered from 16 possible hypotheses to the 12 hypotheses shown in FIG. 4 that are considered.

Figure 5:
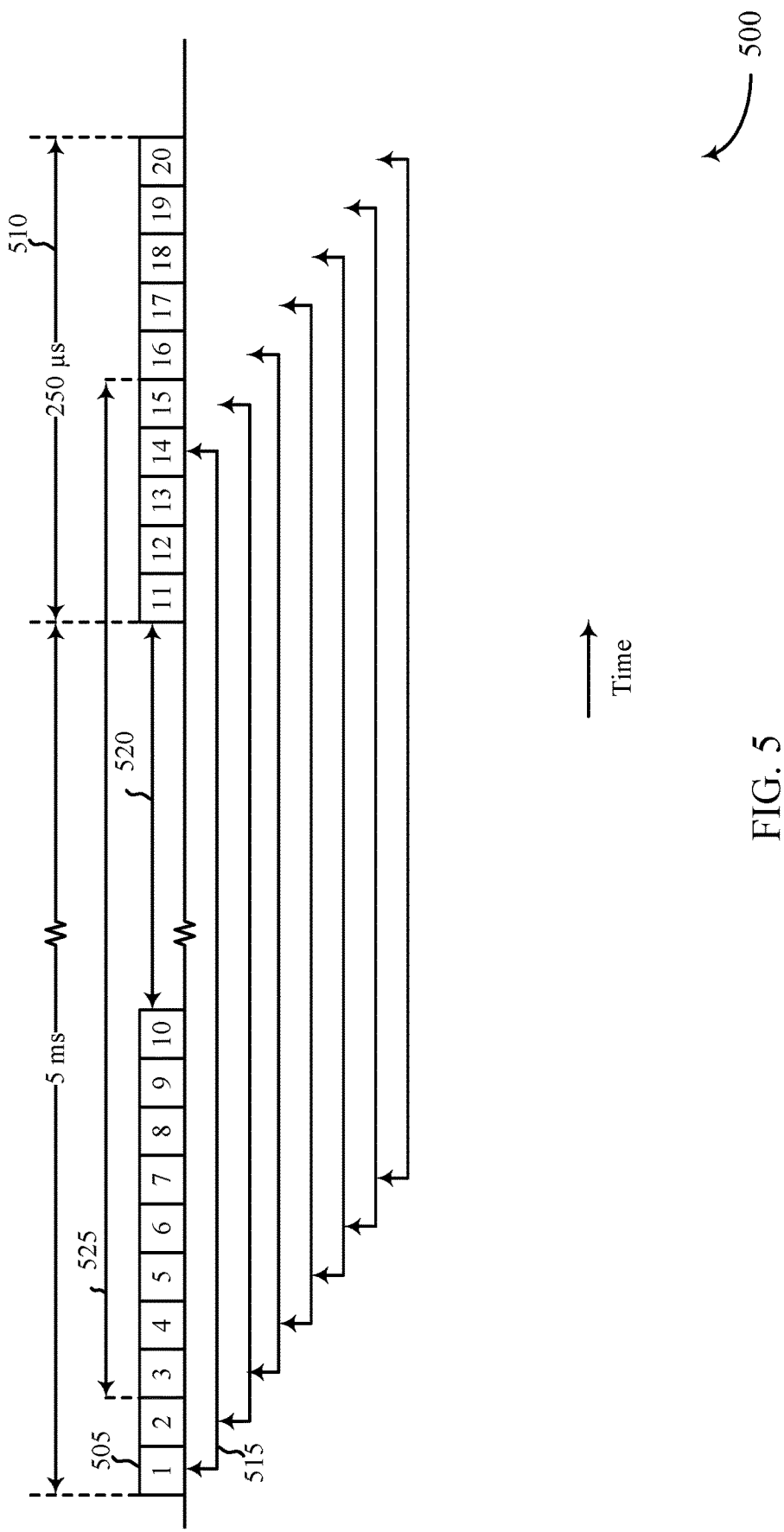

In some examples, a nonuniform inter-block time duration may permit the UE 115 to consider hypotheses where SS blocks occur in different SS bursts. FIG. 5 shows an example timeline 500 of SS blocks 505, and possible identities of first and second SS blocks received by a UE at times separated by a known time increment, in accordance with various aspects of the present disclosure. By way of example, the SS blocks 505 are distributed over two SS block bursts 510, with each SS block burst 510 including ten SS blocks 505. The SS block bursts 510 may have a periodicity of 5 ms, with each SS block burst 510 spanning 250 μs. SS block bursts 510 are separated by time gap 520. In some examples, time gap 520 is a multiple of the time duration of SS block 505. In the example of FIG. 5, the time duration of an SS block 505 is 25 μs, and time gap 520 is equal to the periodicity (5 ms) minus the duration of ten SS blocks (250 μs). The SS blocks 505 may be transmitted by a base station, such as base station 105 or 305 described with reference to FIGS. 1 and 3. A UE, such as UE 115 or 315, may receive one or more of the SS blocks 505.

FIG. 5 assumes that the known time increment separating the first and second detected SS blocks is thirteen SS blocks (e.g., Δt=13 SS blocks). Given the known time increment, and assuming that the SS blocks are transmitted in the pattern illustrated in FIG. 5, the UE may identify seven hypotheses 515 for the identities of the first and second SS blocks and their respective locations within a sequence of SS blocks (e.g., l∈{1, 2, . . . , 7} in pair {l, l+13}). In this example, all of the hypotheses 515 correspond to SS blocks in different SS block bursts. By way of example, the known time increment is based on a number of SS blocks and the inter-block time duration 525 is the known time increment plus the duration of a intervening time gap 520 between SS block burst transmissions.

In this example, UE 115 may discard hypotheses corresponding to SS blocks 8, 9, 10, 11, 12, and 13 because they are not separated in time from any other SS blocks by the inter-block time duration 525. By knowing that, to be considered a valid hypothesis, the SS blocks must be separated by the inter-block time duration 525 (e.g., separated by 13 SS blocks plus the duration of time gap 520), the UE 115 may eliminate hypotheses corresponding to an SS block that is not separated by the inter-block time duration 525 from any other SS block. Hence, the UE 115 may discard hypotheses corresponding to SS blocks 8, 9, 10, 11, 12, and 13, thereby enabling the UE to reduce the number of hypotheses considered from 13 possible hypotheses to 7 hypotheses that are considered.

Beneficially, the techniques described herein provide for identifying SS blocks that have a known timing relationship and hence contain codewords that can be combined according to a smaller subset of the set of all possible combining hypotheses. The number of possible hypotheses may be reduced to only include hypotheses corresponding to SS blocks that have the known timing relationship. Codewords in different SS blocks corresponding to the reduced set of hypotheses may be combined to enable a UE to synchronize and acquire a network faster than in conventional solutions.

Figure 6:
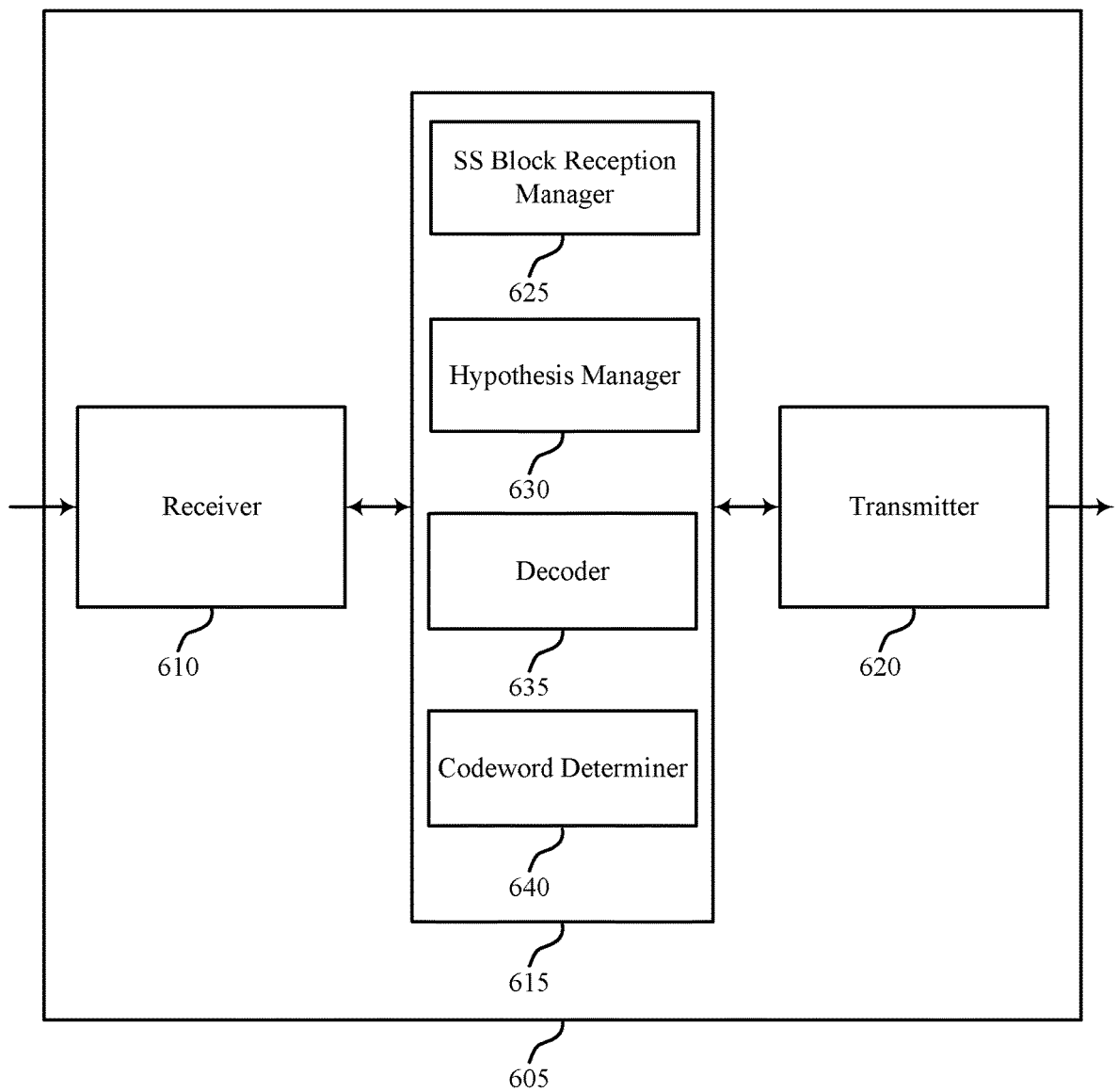
FIG. 6 shows a block diagram of an apparatus for use in wireless communication, in accordance with various aspects of the present disclosure.

FIG. 6 shows a block diagram 600 of an apparatus 605 for use in wireless communication, in accordance with various aspects of the present disclosure. The apparatus 605 may be an example of aspects of one or more of the UEs described with reference to FIGS. 1 and 3. The apparatus 605 may include a receiver 610, a UE wireless communication manager 615, and a transmitter 620. The apparatus 605 may also include a processor. Each of these components may be in communication with one another (e.g., via one or more buses).

The receiver 610 may receive data or control signals or information (i.e., transmissions), some or all of which may be associated with various information channels (e.g., data channels, control channels, etc.). Received signals or information, or measurements performed thereon, may be passed to other components of the apparatus 605. The receiver 610 may include one or a plurality of antennas.

The transmitter 620 may transmit data or control signals or information (i.e., transmissions) generated by other components of the apparatus 605, some or all of which may be associated with various information channels (e.g., data channels, control channels, etc.). In some examples, the transmitter 620 may be collocated with the receiver 610 in a transceiver. For example, the transmitter 620 and receiver 610 may be an example of aspects of the transceiver(s) 1030 described with reference to FIG. 10. The transmitter 620 may include one or a plurality of antennas, which may be separate from (or shared with) the one or more antennas used by the receiver 610.

The UE wireless communication manager 615 and/or at least some of its various sub-components may be implemented in hardware, software executed by a processor, firmware, or any combination thereof. If implemented in software executed by a processor, the functions of the UE wireless communication manager 615 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The UE wireless communication manager 615 and/or at least some of its various sub-components may be physically located at various positions, including being distributed such that portions of functions are implemented at different physical locations by one or more physical devices. In some examples, the UE wireless communication manager 615 and/or at least some of its various sub-components may be a separate and distinct component in accordance with various aspects of the present disclosure. In other examples, the UE wireless communication manager 615 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The UE wireless communication manager 615 may include a SS block reception manager 625, a hypothesis manager 630, decoder 635, and a codeword determiner 640.

The SS block reception manager 625 may be used to receive, in a first SS block, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index for the first SS block or a portion of the first SS block. In some examples, the first codeword may include the first PBCH payload encoded based at least in part on a first linear encoding, with the encoded first PBCH payload and a first CRC for the encoded first PBCH payload encoded based at least in part on a second linear encoding.

The SS block reception manager 625 may also be used to receive, in a second SS block separated in time from the first SS block by a time increment, a second codeword based at least in part on a linear encoding of a second PBCH payload, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second codeword may include the second PBCH payload encoded based at least in part on the first linear encoding, with the encoded second PBCH payload and a second CRC for the encoded second PBCH payload encoded based at least in part on the second linear encoding. In some examples, the time increment may include a number of SS blocks.

In some examples, the first codeword may be received before the second codeword. In other examples, the second codeword may be received before the first codeword. The first codeword and the second codeword may each include a same number of bits. In some examples, the first codeword and the second codeword may be from a predetermined set of timing indicators. In some examples, the first PBCH payload and the second PBCH payload may each include a same MIB. In some examples, the first SS block and the second SS block may be received within a BCH TTI. In some examples, the first SS block and the second SS block may be received within different BCH TTIs. In some examples, the first SS block and the second SS block may each include a PSS, a SSS, or a combination thereof.

The hypothesis manager 630 may be used to determine, based at least in part on the time increment, one or more hypotheses of combined decoding metrics for the first codeword and the second codeword, as described for example with reference to FIGS. 2-5. In some examples, the decoding metrics may include LLRs.

The decoder 635 may be used to decode the first codeword based on each of at least one hypothesis in the one or more hypotheses of combined decoding metrics for the first codeword and the second codeword, as described for example with reference to FIGS. 2-5. The at least one hypothesis may include a correct hypothesis.

The codeword determiner 640 may be used to determine the first codeword based at least in part on a CRC verification performed when decoding the first codeword based at least in part on the correct hypothesis, as described for example with reference to FIGS. 2-5.

Figure 7:
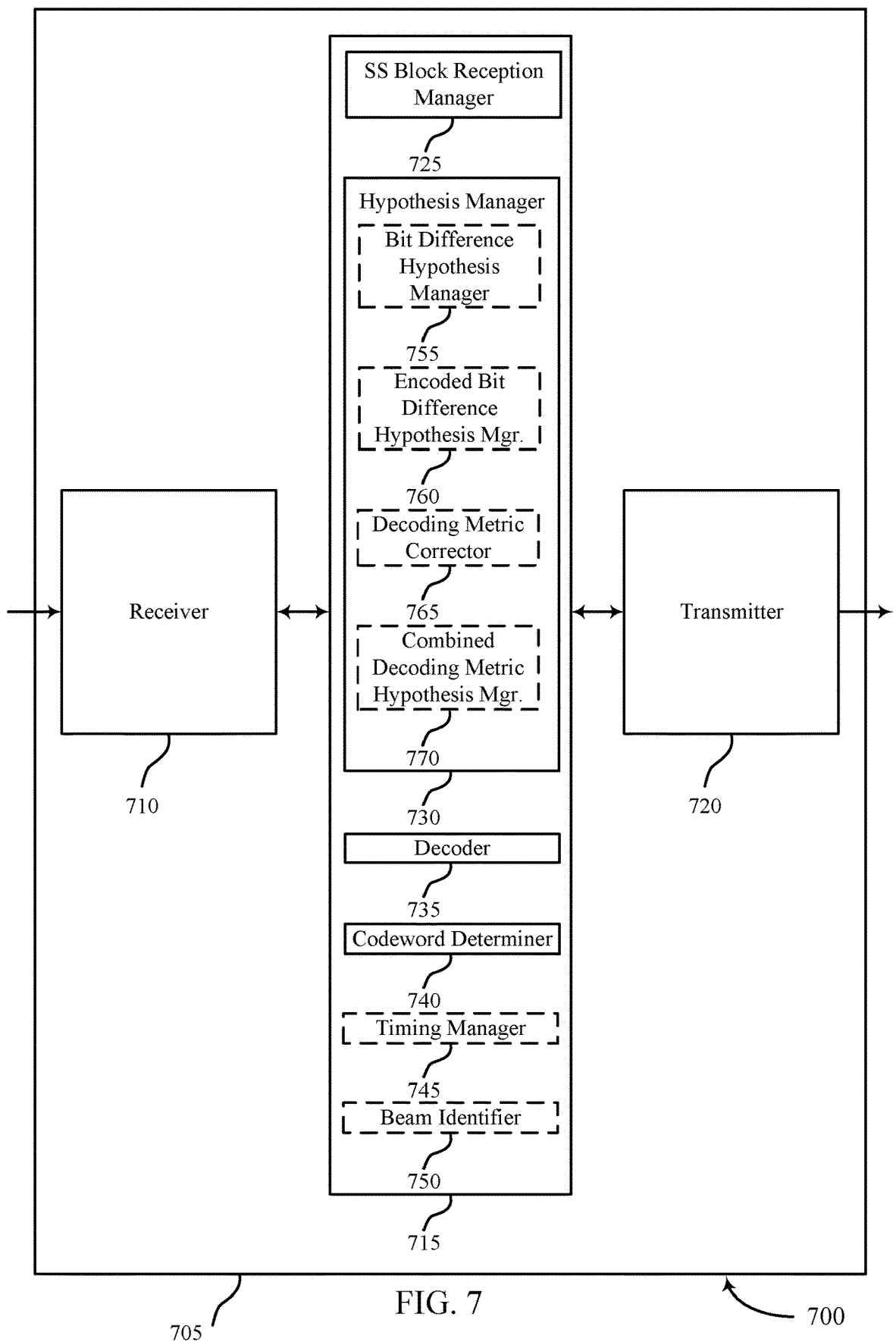
FIG. 7 shows a block diagram of apparatus for use in wireless communication, in accordance with various aspects of the present disclosure.

FIG. 7 shows a block diagram 700 of an apparatus 705 for use in wireless communication, in accordance with various aspects of the present disclosure. The apparatus 705 may be an example of aspects of one or more of the UEs described with reference to FIGS. 1 and 3. The apparatus 705 may include a receiver 710, a UE wireless communication manager 715, and a transmitter 720. The apparatus 705 may also include a processor. Each of these components may be in communication with one another (e.g., via one or more buses).

The receiver 710 may receive data or control signals or information (i.e., transmissions), some or all of which may be associated with various information channels (e.g., data channels, control channels, etc.). Received signals or information, or measurements performed thereon, may be passed to other components of the apparatus 705. The receiver 710 may include one or a plurality of antennas.

The transmitter 720 may transmit data or control signals or information (i.e., transmissions) generated by other components of the apparatus 705, some or all of which may be associated with various information channels (e.g., data channels, control channels, etc.). In some examples, the transmitter 720 may be collocated with the receiver 710 in a transceiver. For example, the transmitter 720 and receiver 710 may be an example of aspects of the transceiver(s) 1030 described with reference to FIG. 10. The transmitter 720 may include one or a plurality of antennas, which may be separate from (or shared with) the one or more antennas used by the receiver 710.

The UE wireless communication manager 715 may be an example of aspects of the UE wireless communication manager 615 described with reference to FIG. 6. The UE wireless communication manager 715 may include a SS block reception manager 725, a hypothesis manager 730, a decoder 735, a codeword determiner 740, an optional timing manager 745, and an optional beam identifier 750. The hypothesis manager 730 may include an optional bit difference hypothesis manager 755, an optional encoded bit difference hypothesis manager 760, an optional decoding metric corrector 765, and an optional combined decoding metric hypothesis manager 770. Each of these components may communicate, directly or indirectly, with one another (e.g., via one or more buses). The SS block reception manager 725, hypothesis manager 730, decoder 735, and codeword determiner 740 may be examples of the SS block reception manager 625, hypothesis manager 630, decoder 635, and codeword determiner 640 described with reference to FIG. 6.

The SS block reception manager 725 may be used to receive, in a first SS block, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first codeword may include the first PBCH payload encoded based at least in part on a first linear encoding, with the encoded first PBCH payload and a first CRC for the encoded first PBCH payload encoded based at least in part on a second linear encoding.

The SS block reception manager 725 may also be used to receive, in a second SS block separated in time from the first SS block by a time increment, a second codeword based at least in part on a linear encoding of a second PBCH payload, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second codeword may include the second PBCH payload encoded based at least in part on the first linear encoding, with the encoded second PBCH payload and a second CRC for the encoded second PBCH payload encoded based at least in part on the second linear encoding. In some examples, the time increment may include a number of SS blocks.

In some examples, the first codeword may be received before the second codeword. In other examples, the second codeword may be received before the first codeword. The first codeword and the second codeword may each include a same number of bits. In some examples, the first codeword and the second codeword may be from a predetermined set of timing indicators. In some examples, the first PBCH payload and the second PBCH payload may each include a same MIB. In some examples, the first SS block and the second SS block may be received within a BCH TTI. In some examples, the first SS block and the second SS block may be received within different BCH TTIs. In some examples, the first SS block and the second SS block may each include a PSS, a SSS, or a combination thereof.

The bit difference hypothesis manager 755 may be used to determine, based at least in part on the time increment, a first intermediate one or more hypotheses for a bit difference between the first timing indicator and the second timing indicator, as described for example with reference to FIGS. 2-5.

The encoded bit difference hypothesis manager 760 may be used to determine, based at least in part on the first intermediate one or more hypotheses for the bit difference, a second intermediate one or more hypotheses for an encoded bit difference between the first codeword and the second codeword, as described for example with reference to FIGS. 2-5.

The decoding metric corrector 765 may be used to correct a second set of decoding metrics for the second codeword based at least in part on at least one of the second intermediate one or more hypotheses, as described for example with reference to FIGS. 2-5.

The combined decoding metric hypothesis manager 770 may be used to combine each corrected second set of decoding metrics with a first set of decoding metrics for the first codeword, to determine the one or more hypotheses of combined decoding metrics for the first codeword and the second codeword. In some examples, the first set of decoding metrics and second set of decoding metrics may include LLRs, as described for example with reference to FIGS. 2-5.

The decoder 735 may be used to decode the first codeword based on each of at least one hypothesis in the one or more hypotheses of combined decoding metrics for the first codeword and the second codeword, as described for example with reference to FIGS. 2-5. The at least one hypothesis may include a correct hypothesis.

The codeword determiner 740 may be used to determine the first codeword based at least in part on a CRC verification performed when decoding the first codeword based at least in part on the correct hypothesis, as described for example with reference to FIGS. 2-5.

The timing manager 745 may be used to determine a first timing of the first SS block within a BCH TTI, based at least in part on the first SS block index, as described for example with reference to FIGS. 2-5.

The beam identifier 750 may be used to identify, based at least in part on the first SS block index, a beam on which the first SS block is transmitted, as described for example with reference to FIGS. 2-5.

Figure 8:
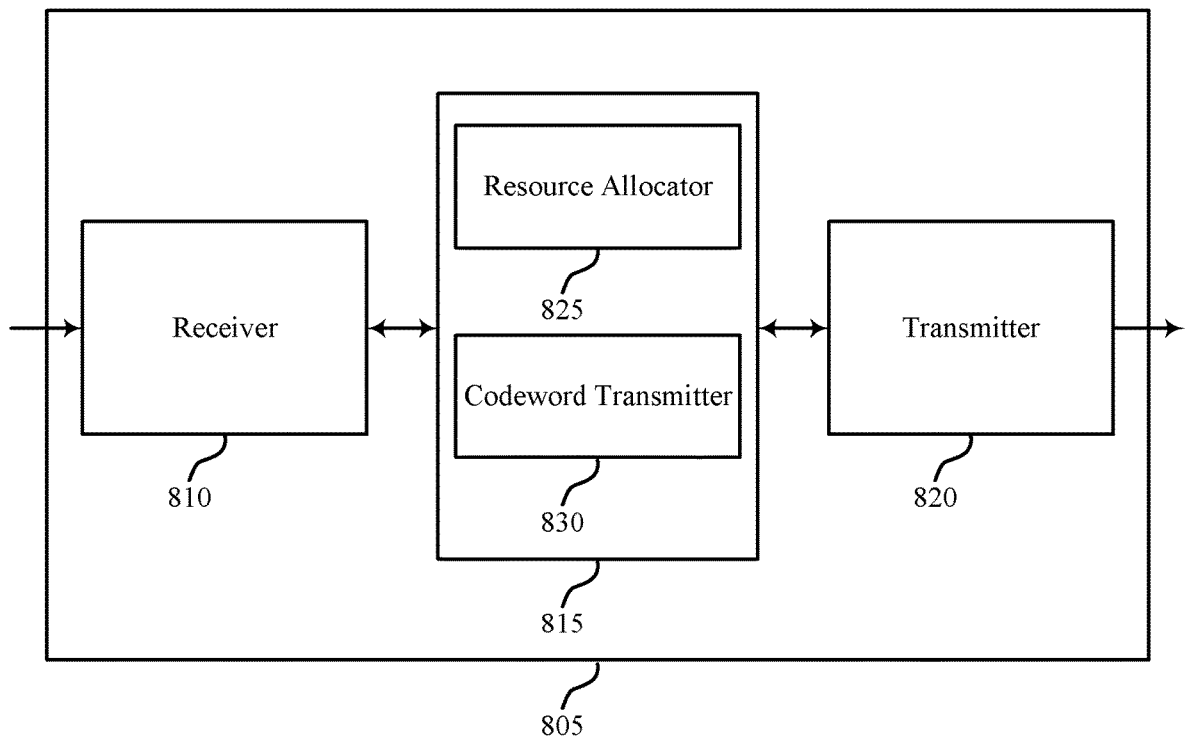
FIG. 8 shows a block diagram of an apparatus for use in wireless communication, in accordance with various aspects of the present disclosure.

FIG. 8 shows a block diagram 800 of an apparatus 805 for use in wireless communication, in accordance with various aspects of the present disclosure. The apparatus 805 may be an example of aspects of one or more of the base stations described with reference to FIGS. 1 and 3. The apparatus 805 may include a receiver 810, a base station wireless communication manager 815, and a transmitter 820. The apparatus 805 may also include a processor. Each of these components may be in communication with one another (e.g., via one or more buses).

The receiver 810 may receive data or control signals or information (i.e., transmissions), some or all of which may be associated with various information channels (e.g., data channels, control channels, etc.). Received signals or information, or measurements performed thereon, may be passed to other components of the apparatus 805. The receiver 810 may include one or a plurality of antennas.

The transmitter 820 may transmit data or control signals or information (i.e., transmissions) generated by other components of the apparatus 805, some or all of which may be associated with various information channels (e.g., data channels, control channels, etc.). In some examples, the transmitter 820 may be collocated with the receiver 810 in a transceiver. For example, the transmitter 820 and receiver 810 may be an example of aspects of the transceiver(s) 1150 described with reference to FIG. 11. The transmitter 820 may include one or a plurality of antennas, which may be separate from (or shared with) the one or more antennas used by the receiver 810.

The base station wireless communication manager 815 and/or at least some of its various sub-components may be implemented in hardware, software executed by a processor, firmware, or any combination thereof. If implemented in software executed by a processor, the functions of the base station wireless communication manager 815 and/or at least some of its various sub-components may be executed by a general-purpose processor, a DSP, an ASIC, a FPGA or other programmable logic device, discrete gate or transistor logic, discrete hardware components, or any combination thereof designed to perform the functions described in the present disclosure.

The base station wireless communication manager 815 and/or at least some of its various sub-components may be physically located at various positions, including being distributed such that portions of functions are implemented at different physical locations by one or more physical devices. In some examples, the base station wireless communication manager 815 and/or at least some of its various sub-components may be a separate and distinct component in accordance with various aspects of the present disclosure. In other examples, the base station wireless communication manager 815 and/or at least some of its various sub-components may be combined with one or more other hardware components, including but not limited to an I/O component, a transceiver, another computing device, one or more other components described in the present disclosure, or a combination thereof, in accordance with various aspects of the present disclosure. The base station wireless communication manager 815 may include a resource allocator 825 and a codeword transmitter 830.

The resource allocator 825 may be used to allocate resources for a plurality of SS blocks, as described for example with reference to FIGS. 2-5. In some examples, the resources allocated for the plurality of SS blocks may be within a BCH TTI. In some examples, the resources allocated for the plurality of SS blocks may be within different BCH TTIs.

The codeword transmitter 830 may be used to transmit, in a first SS block of a first SS block burst that is separated in time from a second SS block burst by a time gap, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first SS block index may identify a first timing of the first SS block within a BCH TTI. In some examples, the first SS block index may identify a first beam on which the first SS block is transmitted.

The codeword transmitter 830 may also be used to transmit, in a second SS block separated in time from the first SS block by an inter-block time duration that includes a time increment, a second codeword based at least in part on a linear encoding of a second PBCH payload, as described for example with reference to FIGS. 2-5. The second SS block may be transmitted in the first SS block burst, and the inter-block time duration may be equal to the time increment. Alternatively, the second SS block may be transmitted in the second SS block burst, and the inter-block time duration may include the time gap. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second SS block index may identify a second timing of the second SS block within the BCH TTI. In some examples, the second SS block index may identify a second beam on which the second SS block is transmitted. In some examples, the time increment may include a number of SS blocks.

The first codeword and the second codeword may each include a same number of bits. In some examples, the base station wireless communication manager 815 may select the first timing indicator and the second timing indicator from a predetermined set of timing indicators. In some examples, the first PBCH payload and the second PBCH payload may each include a same MIB. In some examples, the first SS block and the second SS block may each include a PSS, a SSS, or a combination thereof.

Figure 9:
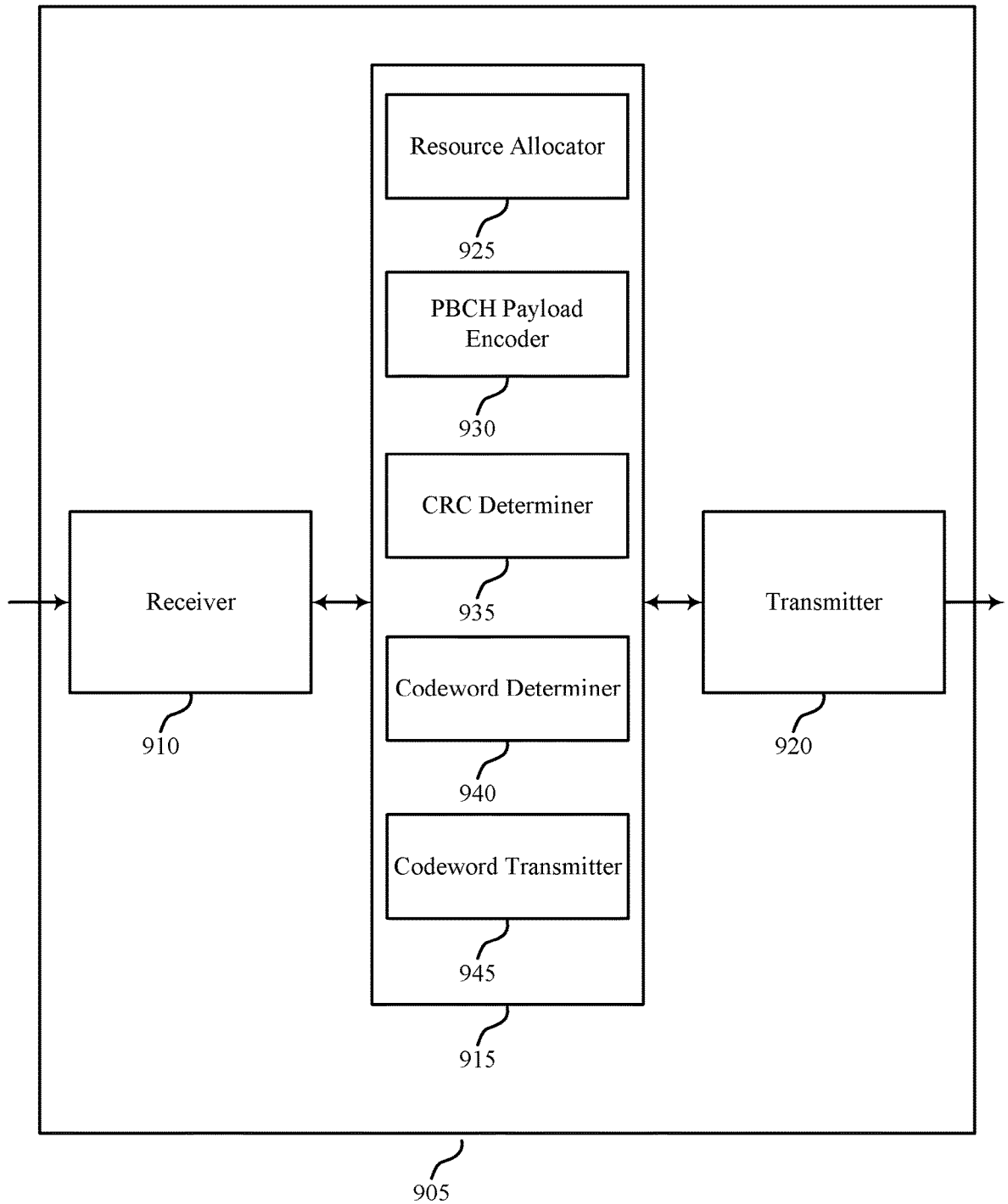
FIG. 9 shows a block diagram of apparatus for use in wireless communication, in accordance with various aspects of the present disclosure.

FIG. 9 shows a block diagram 900 of an apparatus 905 for use in wireless communication, in accordance with various aspects of the present disclosure. The apparatus 905 may be an example of aspects of one or more of the base stations described with reference to FIGS. 1 and 3. The apparatus 905 may include a receiver 910, a base station wireless communication manager 915, and a transmitter 920. The apparatus 905 may also include a processor. Each of these components may be in communication with one another (e.g., via one or more buses).

The receiver 910 may receive data or control signals or information (i.e., transmissions), some or all of which may be associated with various information channels (e.g., data channels, control channels, etc.). Received signals or information, or measurements performed thereon, may be passed to other components of the apparatus 905. The receiver 910 may include one or a plurality of antennas.

The transmitter 920 may transmit data or control signals or information (i.e., transmissions) generated by other components of the apparatus 905, some or all of which may be associated with various information channels (e.g., data channels, control channels, etc.). In some examples, the transmitter 920 may be collocated with the receiver 910 in a transceiver. For example, the transmitter 920 and receiver 910 may be an example of aspects of the transceiver(s) 1150 described with reference to FIG. 11. The transmitter 920 may include one or a plurality of antennas, which may be separate from (or shared with) the one or more antennas used by the receiver 910.

The base station wireless communication manager 915 may be an example of aspects of the base station wireless communication manager 815 described with reference to FIG. 8. The base station wireless communication manager 915 may include a resource allocator 925, a PBCH payload encoder 930, a CRC determiner 935, a codeword determiner 940, and a codeword transmitter 945. Each of these components may communicate, directly or indirectly, with one another (e.g., via one or more buses). The resource allocator 925 and codeword transmitter 945 may be examples of the resource allocator 825 and codeword transmitter 830 described with reference to FIG. 8.

The resource allocator 925 may be used to allocate resources for a plurality of SS blocks, as described for example with reference to FIGS. 2-5. In some examples, the resources allocated for the plurality of SS blocks may be within a BCH TTI. In some examples, the resources allocated for the plurality of SS blocks may be within different BCH TTIs.

The PBCH payload encoder 930 may be used to encode a first PBCH payload based at least in part on a first linear encoding, as described for example with reference to FIGS. 2-5. The first PBCH payload may include a first timing indicator for the first SS block. In some examples, the first timing indicator may include a first SS block index, for the first SS block or a portion of the first SS block. In some examples, the first SS block index may identify a first timing of the first SS block within a BCH TTI. In some examples, the first SS block index may identify a first beam on which the first SS block is transmitted.

The PBCH payload encoder 930 may also be used to encode a second PBCH payload based at least in part on the first linear encoding, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second SS block index may identify a second timing of the second SS block within the BCH TTI. In some examples, the second SS block index may identify a second beam on which the second SS block is transmitted.

The CRC determiner 935 may be used to determine a first CRC for the encoded first PBCH payload, as described for example with reference to FIGS. 2-5. The CRC determiner 935 may also be used to determine a second CRC for the encoded second PBCH payload.

The codeword determiner 940 may be used to determine a first codeword by encoding the encoded first PBCH payload and the first CRC based at least in part on a second linear encoding, as described for example with reference to FIGS. 2-5. The codeword determiner may also be used to determine a second codeword by encoding the encoded second PBCH payload and the second CRC based at least in part on the second linear encoding.

The codeword transmitter 945 may be used to transmit the first codeword in a first SS block of a first SS block burst that is separated in time from a second SS block burst by a time gap, as described for example with reference to FIGS. 2-5. The codeword transmitter 945 may also be used to transmit the second codeword in a second SS block separated in time from the first SS block by an inter-block time duration that includes a time increment. In some examples, the time increment may include a number of SS blocks. In some examples, the second SS block may be transmitted in the first SS block burst, and the inter-block time duration may be equal to the time increment. In some examples, the second SS block may be transmitted in the second SS block burst, and the inter-block time duration may include the time gap.

The first codeword and the second codeword may each include a same number of bits. In some examples, the base station wireless communication manager 915 may select the first codeword and the second codeword from a predetermined set of timing indicators. In some examples, the first PBCH payload and the second PBCH payload may each include a same MIB. In some examples, the first SS block and the second SS block may each include a PSS, a SSS, or a combination thereof.

Figure 10:
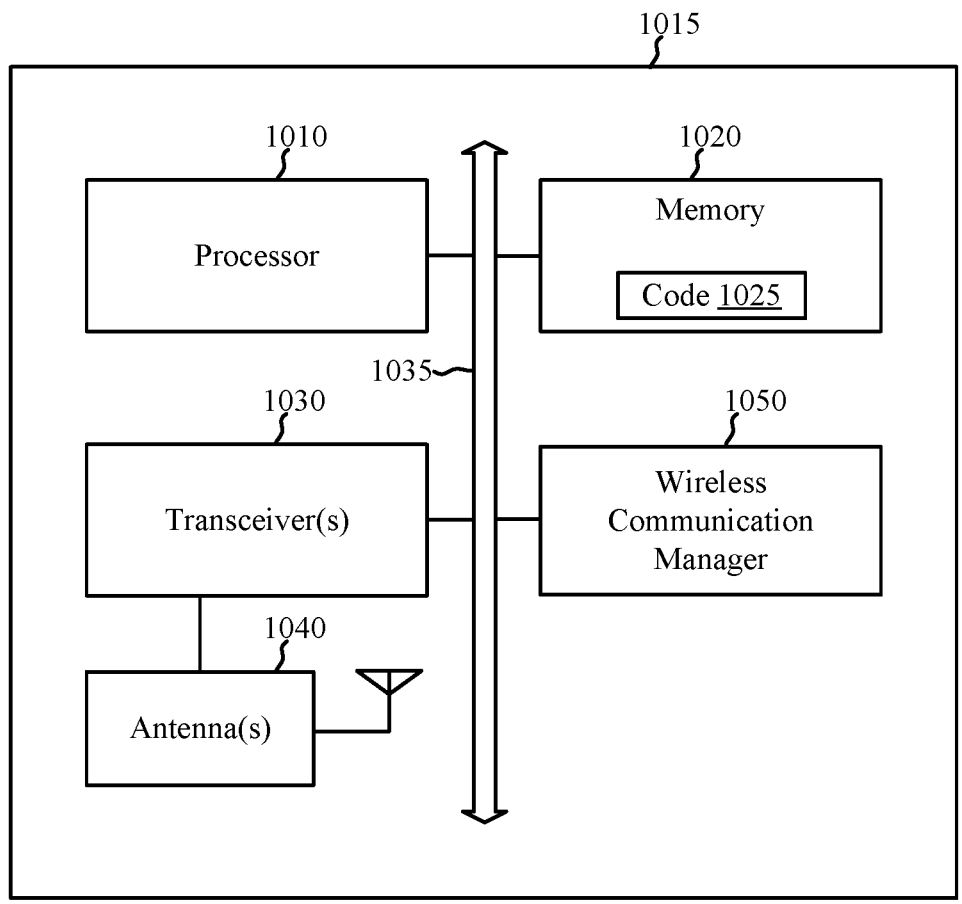
FIG. 10 shows a block diagram of a UE for use in wireless communication, in accordance with various aspects of the present disclosure.

FIG. 10 shows a block diagram 1000 of a UE 1015 for use in wireless communication, in accordance with various aspects of the present disclosure. The UE 1015 may be included or be part of a personal computer (e.g., a laptop computer, a netbook computer, a tablet computer, etc.), a cellular telephone, a PDA, a digital video recorder (DVR), an internet appliance, a gaming console, an e-reader, a vehicle, a home appliance, a lighting or alarm control system, etc. The UE 1015 may, in some examples, have an internal power supply (not shown), such as a small battery, to facilitate mobile operation. In some examples, the UE 1015 may be an example of aspects of one or more of the UEs described with reference to FIGS. 1 and 3, or aspects of the apparatus described with reference to FIG. 6. The UE 1015 may be configured to implement at least some of the UE or apparatus techniques or functions described with reference to FIGS. 1-7.

The UE 1015 may include a processor 1010, a memory 1020, at least one transceiver (represented by transceiver(s) 1030), antennas 1040 (e.g., an antenna array), or a UE wireless communication manager 1050. Each of these components may be in communication with each other, directly or indirectly, over one or more buses 1035.

The memory 1020 may include random access memory (RAM) or read-only memory (ROM). The memory 1020 may store computer-readable, computer-executable code 1025 containing instructions that are configured to, when executed, cause the processor 1010 to perform various functions described herein related to wireless communication, including, for example, receiving and decoding one or more SS blocks including a PBCH payload that includes a SS block index. Alternatively, the computer-executable code 1025 may not be directly executable by the processor 1010 but be configured to cause the UE 1015 (e.g., when compiled and executed) to perform various of the functions described herein.

The processor 1010 may include an intelligent hardware device, e.g., a central processing unit (CPU), a microcontroller, an ASIC, etc. The processor 1010 may process information received through the transceiver(s) 1030 or information to be sent to the transceiver(s) 1030 for transmission through the antennas 1040. The processor 1010 may handle, alone or in connection with the UE wireless communication manager 1050, one or more aspects of communicating over (or managing communications over) one or more radio frequency spectrum bands.

The transceiver(s) 1030 may include a modem configured to modulate packets and provide the modulated packets to the antennas 1040 for transmission, and to demodulate packets received from the antennas 1040. The transceiver(s) 1030 may, in some examples, be implemented as one or more transmitters and one or more separate receivers. The transceiver(s) 1030 may support communications in one or more radio frequency spectrum bands. The transceiver(s) 1030 may be configured to communicate bi-directionally, via the antennas 1040, with one or more base stations or apparatuses, such as one or more of the base stations described with reference to FIG. 1, 3, or 8.

The UE wireless communication manager 1050 may be configured to perform or control some or all of the UE or apparatus techniques or functions described with reference to FIGS. 1-7. The UE wireless communication manager 1050, or portions of it, may include a processor, or some or all of the functions of the UE wireless communication manager 1050 may be performed by the processor 1010 or in connection with the processor 1010. In some examples, the UE wireless communication manager 1050 may be an example of aspects of one or more of the UE wireless communication managers described with reference to FIGS. 6 and 7.

Figure 11:
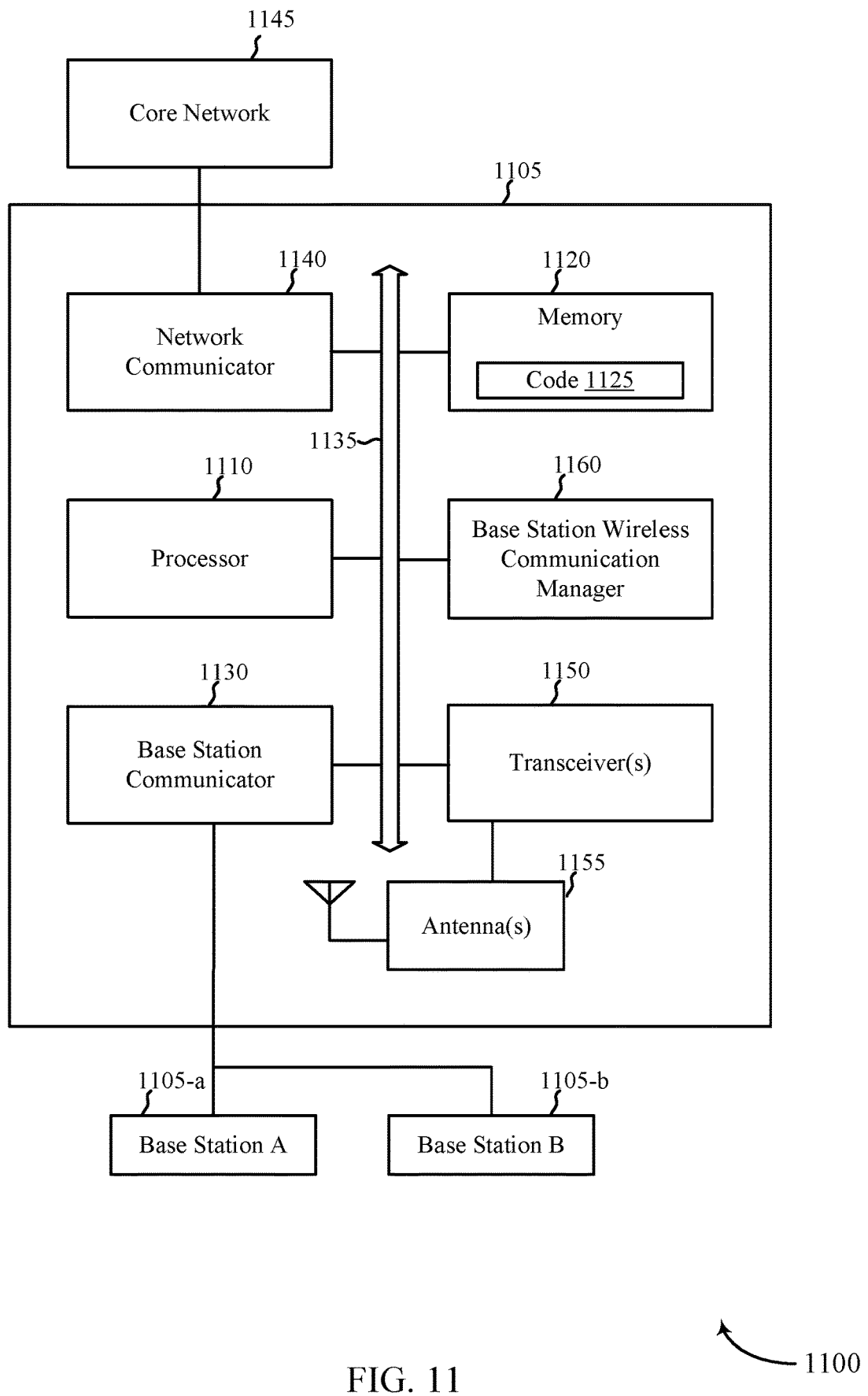
FIG. 11 shows a block diagram of a base station for use in wireless communication, in accordance with various aspects of the present disclosure.

FIG. 11 shows a block diagram 1100 of a base station 1105 for use in wireless communication, in accordance with various aspects of the present disclosure. In some examples, the base station 1105 may be an example of aspects of one or more of the base stations described with reference to FIGS. 1 and 3, or aspects of the apparatus described with reference to FIG. 8. The base station 1105 may be configured to implement or facilitate at least some of the base station or apparatus techniques or functions described with reference to FIGS. 1-5, 8, and 9.

The base station 1105 may include a processor 1110, a memory 1120, at least one transceiver (represented by transceiver(s) 1150), at least one antenna 1155 (e.g., an antenna array), or a base station wireless communication manager 1160. The base station 1105 may also include one or more of a base station communicator 1130 or a network communicator 1140. Each of these components may be in communication with each other, directly or indirectly, over one or more buses 1135.

The memory 1120 may include RAM or ROM. The memory 1120 may store computer-readable, computer-executable code 1125 containing instructions that are configured to, when executed, cause the processor 1110 to perform various functions described herein related to wireless communication, including, for example, allocating resources for SS blocks and transmitting one or more SS blocks including a PBCH payload that includes a SS block index. Alternatively, the computer-executable code 1125 may not be directly executable by the processor 1110 but be configured to cause the base station 1105 (e.g., when compiled and executed) to perform various of the functions described herein.

The processor 1110 may include an intelligent hardware device, e.g., a CPU, a microcontroller, an ASIC, etc. The processor 1110 may process information received through the transceiver(s) 1150, the base station communicator 1130, or the network communicator 1140. The processor 1110 may also process information to be sent to the transceiver(s) 1150 for transmission through the antennas 1155, or to the base station communicator 1130 for transmission to one or more other base stations (e.g., base station 1105-*a* and base station 1105-*b*), or to the network communicator 1140 for transmission to a core network 1145, which may be an example of one or more aspects of the core network 130 described with reference to FIG. 1. The processor 1110 may handle, alone or in connection with the base station wireless communication manager 1160, one or more aspects of communicating over (or managing communications over) one or more radio frequency spectrum bands.

The transceiver(s) 1150 may include a modem configured to modulate packets and provide the modulated packets to the antennas 1155 for transmission, and to demodulate packets received from the antennas 1155. The transceiver(s) 1150 may, in some examples, be implemented as one or more transmitters and one or more separate receivers. The transceiver(s) 1150 may support communications in one or more radio frequency spectrum bands. The transceiver(s) 1150 may be configured to communicate bi-directionally, via the antennas 1155, with one or more UEs or apparatuses, such as one or more of the UEs or apparatus described with reference to FIG. 1, 3, 6, or 10. The base station 1105 may communicate with the core network 1145 through the network communicator 1140. The base station 1105 may also communicate with other base stations, such as the base station 1105-*a* and the base station 1105-*b*, using the base station communicator 1130.

The base station wireless communication manager 1160 may be configured to perform or control some or all of the base station or apparatus techniques or functions described with reference to FIGS. 1-5, 8, and 9. The base station wireless communication manager 1160, or portions of it, may include a processor, or some or all of the functions of the base station wireless communication manager 1160 may be performed by the processor 1110 or in connection with the processor 1110. In some examples, the base station wireless communication manager 1160 may be an example of aspects of one or more of the base station wireless communication managers described with reference to FIGS. 8 and 9.

Figure 12:
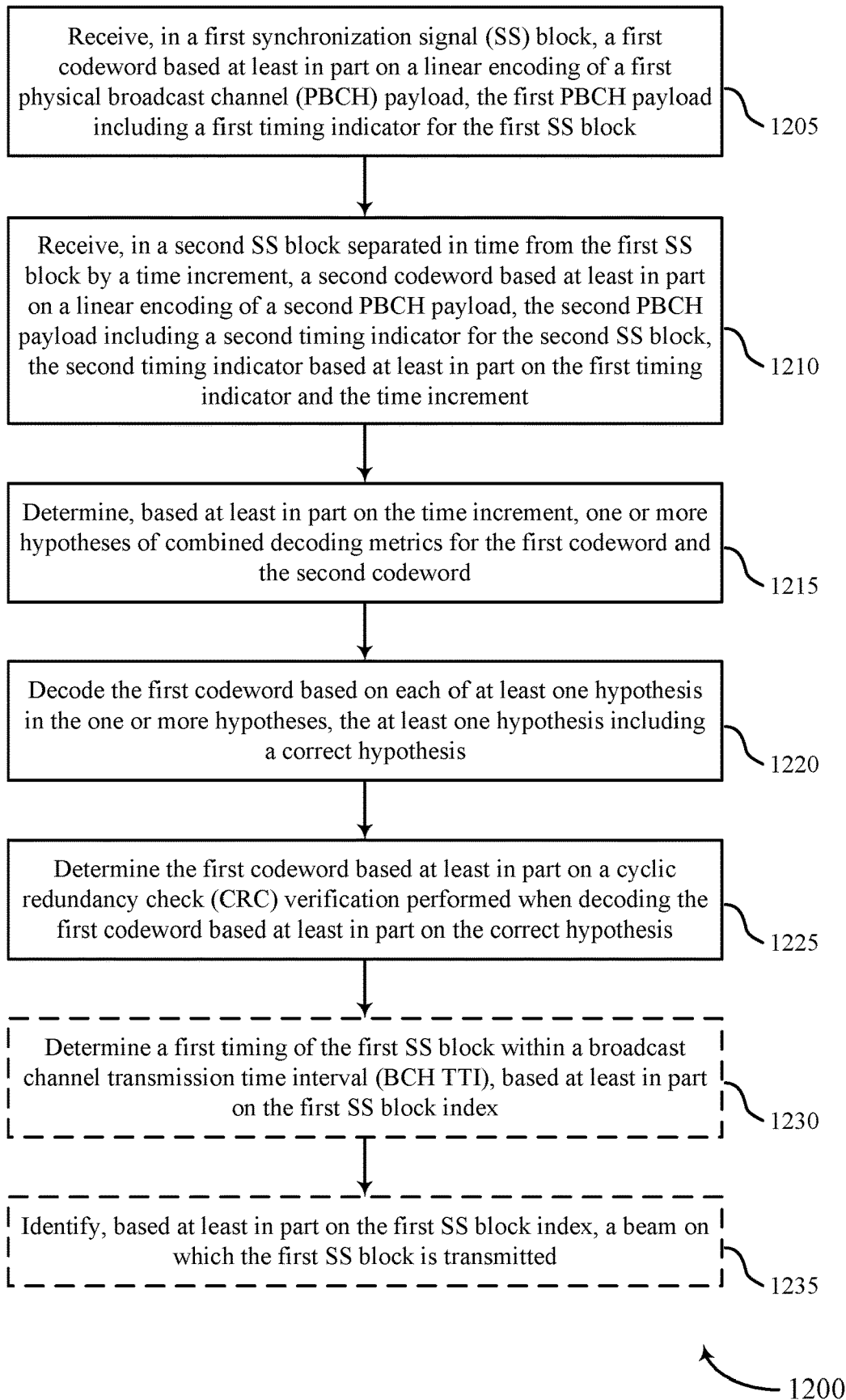
FIGS. 12-14 are flow charts illustrating examples of methods for wireless communication at a UE, in accordance with various aspects of the present disclosure.

FIG. 12 is a flow chart illustrating an example of a method 1200 for wireless communication at a UE, in accordance with various aspects of the present disclosure. For clarity, the method 1200 is described below with reference to aspects of one or more of the UEs described with reference to FIGS. 1, 3, and 10, aspects of the apparatus described with reference to FIG. 6, or aspects of one or more of the UE wireless communication managers described with reference to FIGS. 6, 7, and 10. In some examples, a UE may execute one or more sets of codes to control the functional elements of the UE to perform the functions described below. Additionally or alternatively, the UE may perform one or more of the functions described below using special-purpose hardware.

At block 1205, the method 1200 may include receiving, in a first SS block, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first codeword may include the first PBCH payload encoded based at least in part on a first linear encoding, with the encoded first PBCH payload and a first CRC for the encoded first PBCH payload encoded based at least in part on a second linear encoding. In some examples, the operation(s) at block 1205 may be performed using the SS block reception manager described with reference to FIGS. 6 and 7.

At block 1210, the method 1200 may include receiving, in a second SS block separated in time from the first SS block by a time increment, a second codeword based at least in part on a linear encoding of a second PBCH payload, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second codeword may include the second PBCH payload encoded based at least in part on the first linear encoding, with the encoded second PBCH payload and a second CRC for the encoded second PBCH payload encoded based at least in part on the second linear encoding. In some examples, the time increment may include a number of SS blocks. In some examples, the operation(s) at block 1210 may be performed using the SS block reception manager described with reference to FIGS. 6 and 7.

Although the order of blocks in the method 1200 imply that the first codeword is received before the second codeword, the first codeword may be received before the second codeword, or the second codeword may be received before the first codeword. The first codeword and the second codeword may each include a same number of bits. In some examples, the first codeword and the second codeword may be from a predetermined set of timing indicators. In some examples, the first PBCH payload and the second PBCH payload may each include a same MIB. In some examples, the first SS block and the second SS block may be received within a BCH TTI. In some examples, the first SS block and the second SS block may be received within different BCH TTIs. In some examples, the first SS block and the second SS block may each include a PSS, a SSS, or a combination thereof.

At block 1215, the method 1200 may include determining, based at least in part on the time increment, one or more hypotheses of combined decoding metrics for the first codeword and the second codeword, as described for example with reference to FIGS. 2-5. In some examples, the decoding metrics may include LLRs. In some examples, the operation (s) at block 1215 may be performed using the hypothesis manager described with reference to FIGS. 6 and 7.

At block 1220, the method 1200 may include decoding the first codeword based on each of at least one hypothesis in the one or more hypotheses of combined decoding metrics for the first codeword and the second codeword, as described for example with reference to FIGS. 2-5. The at least one hypothesis may include a correct hypothesis. In some examples, the operation(s) at block 1220 may be performed using the decoder described with reference to FIGS. 6 and 7.

At block 1225, the method 1200 may include determining the first codeword based at least in part on a CRC verification performed when decoding the first codeword based at least in part on the correct hypothesis, as described for example with reference to FIGS. 2-5. In some examples, the operation(s) at block 1225 may be performed using the codeword determiner described with reference to FIGS. 6 and 7.

At block 1230, the method 1200 may optionally include determining a first timing of the first SS block within a BCH TTI, based at least in part on the first SS block index, as described for example with reference to FIGS. 2-5. In some examples, the operation(s) at block 1230 may be performed using the timing manager described with reference to FIG. 7.

At block 1235, the method 1200 may optionally include identifying, based at least in part on the first SS block index, a beam on which the first SS block is transmitted, as described for example with reference to FIGS. 2-5. In some examples, the operation(s) at block 1235 may be performed using the beam identifier described with reference to FIG. 7.

Figure 13:
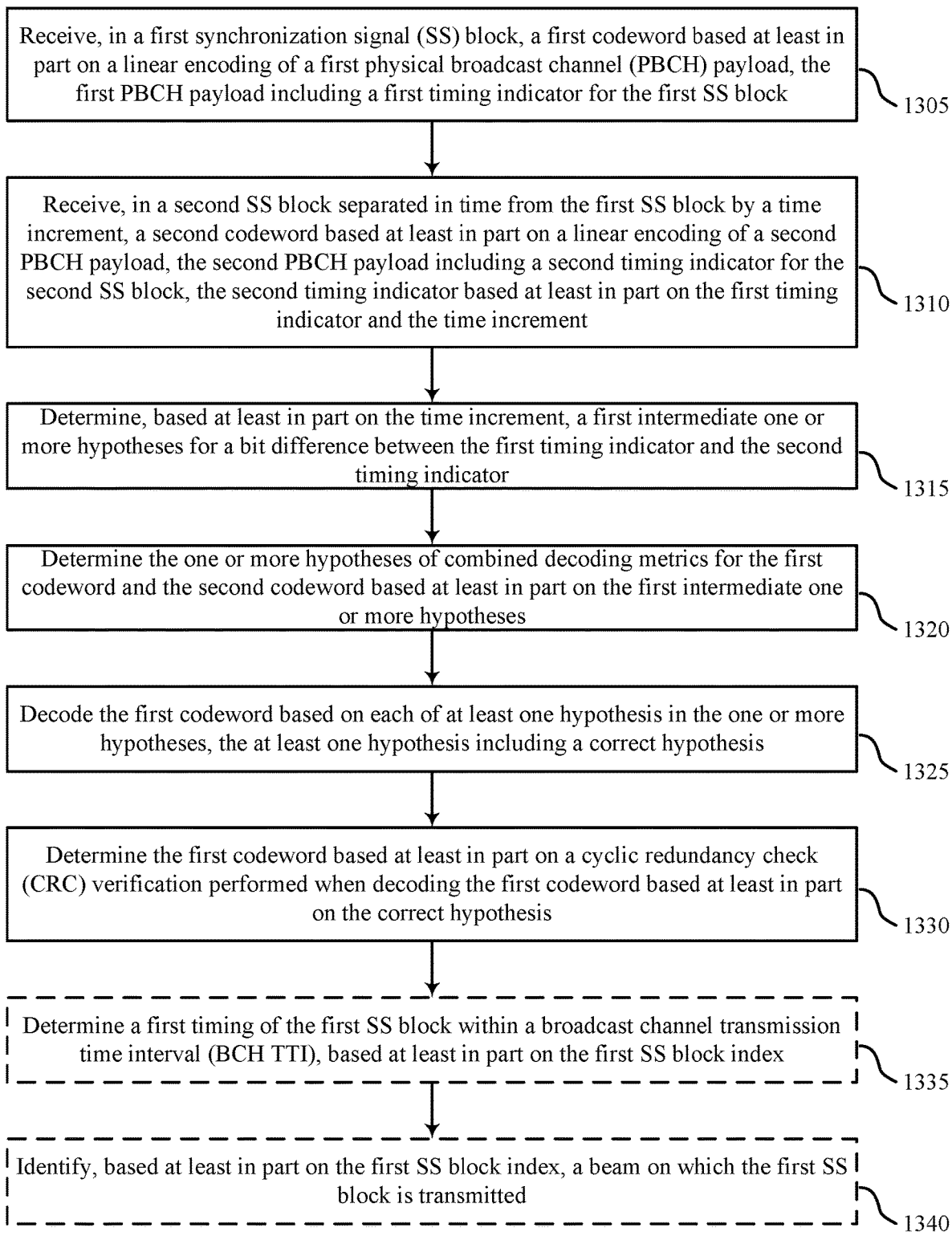

FIG. 13 is a flow chart illustrating an example of a method 1300 for wireless communication at a UE, in accordance with various aspects of the present disclosure. For clarity, the method 1300 is described below with reference to aspects of one or more of the UEs described with reference to FIGS. 1,3, and 10, aspects of the apparatus described with reference to FIG. 6, or aspects of one or more of the UE wireless communication managers described with reference to FIGS. 6,7, and 10. In some examples, a UE may execute one or more sets of codes to control the functional elements of the UE to perform the functions described below. Additionally or alternatively, the UE may perform one or more of the functions described below using special-purpose hardware.

At block 1305, the method 1300 may include receiving, in a first SS block, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first codeword may include the first PBCH payload encoded based at least in part on a first linear encoding, with the encoded first PBCH payload and a first CRC for the encoded first PBCH payload encoded based at least in part on a second linear encoding. In some examples, the operation(s) at block 1305 may be performed using the SS block reception manager described with reference to FIGS. 6 and 7.

At block 1310, the method 1300 may include receiving, in a second SS block separated in time from the first SS block by a time increment, a second codeword based at least in part on a linear encoding of a second PBCH payload, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second codeword may include the second PBCH payload encoded based at least in part on the first linear encoding, with the encoded second PBCH payload and a second CRC for the encoded second PBCH payload encoded based at least in part on the second linear encoding. In some examples, the time increment may include a number of SS blocks. In some examples, the operation(s) at block 1310 may be performed using the SS block reception manager described with reference to FIGS. 6 and 7.

Although the order of blocks in the method 1300 imply that the first codeword is received before the second codeword, the first codeword may be received before the second codeword, or the second codeword may be received before the first codeword. The first codeword and the second codeword may each include a same number of bits. In some examples, the first codeword and the second codeword may be from a predetermined set of timing indicators. In some examples, the first PBCH payload and the second PBCH payload may each include a same MIB. In some examples, the first SS block and the second SS block may be received within a BCH TTI. In some examples, the first SS block and the second SS block may be received within different BCH TTIs. In some examples, the first SS block and the second SS block may each include a PSS, a SSS, or a combination thereof.

At blocks 1315 and 1320, the method 1300 may include determining, based at least in part on the time increment, one or more hypotheses of combined decoding metrics for the first codeword and the second codeword, as described for example with reference to FIGS. 2-5. At block 1315, the method 1300 may include determining, based at least in part on the time increment, a first intermediate one or more hypotheses for a bit difference between the first timing indicator and the second timing indicator. In some examples, the operation(s) at block 1315 may be performed using the hypothesis manager described with reference to FIGS. 6 and 7, or the bit difference hypothesis manager described with reference to FIG. 7.

At block 1320, the method 1300 may include determining the one or more hypotheses of combined decoding metrics for the first codeword and the second codeword based at least in part on the first intermediate one or more hypotheses. In some examples, the decoding metrics may include LLRs. In some examples, the operation(s) at block 1320 may be performed using the hypothesis manager described with reference to FIGS. 6 and 7, or the combined decoding metric hypothesis manager described with reference to FIG. 7.

At block 1325, the method 1300 may include decoding the first codeword based on each of at least one hypothesis in the one or more hypotheses of combined decoding metrics for the first codeword and the second codeword, as described for example with reference to FIGS. 2-5. The at least one hypothesis may include a correct hypothesis. In some examples, the operation(s) at block 1325 may be performed using the decoder described with reference to FIGS. 6 and 7.

At block 1330, the method 1300 may include determining the first codeword based at least in part on a CRC verification performed when decoding the first codeword based at least in part on the correct hypothesis, as described for example with reference to FIGS. 2-5. In some examples, the operation(s) at block 1330 may be performed using the codeword determiner described with reference to FIGS. 6 and 7.

At block 1335, the method 1300 may optionally include determining a first timing of the first SS block within a BCH TTI, based at least in part on the first SS block index, as described for example with reference to FIGS. 2-5. In some examples, the operation(s) at block 1335 may be performed using the timing manager described with reference to FIG. 7.

At block 1340, the method 1300 may optionally include identifying, based at least in part on the first SS block index, a beam on which the first SS block is transmitted, as described for example with reference to FIGS. 2-5. In some examples, the operation(s) at block 1340 may be performed using the beam identifier described with reference to FIG. 7.

Figure 14:
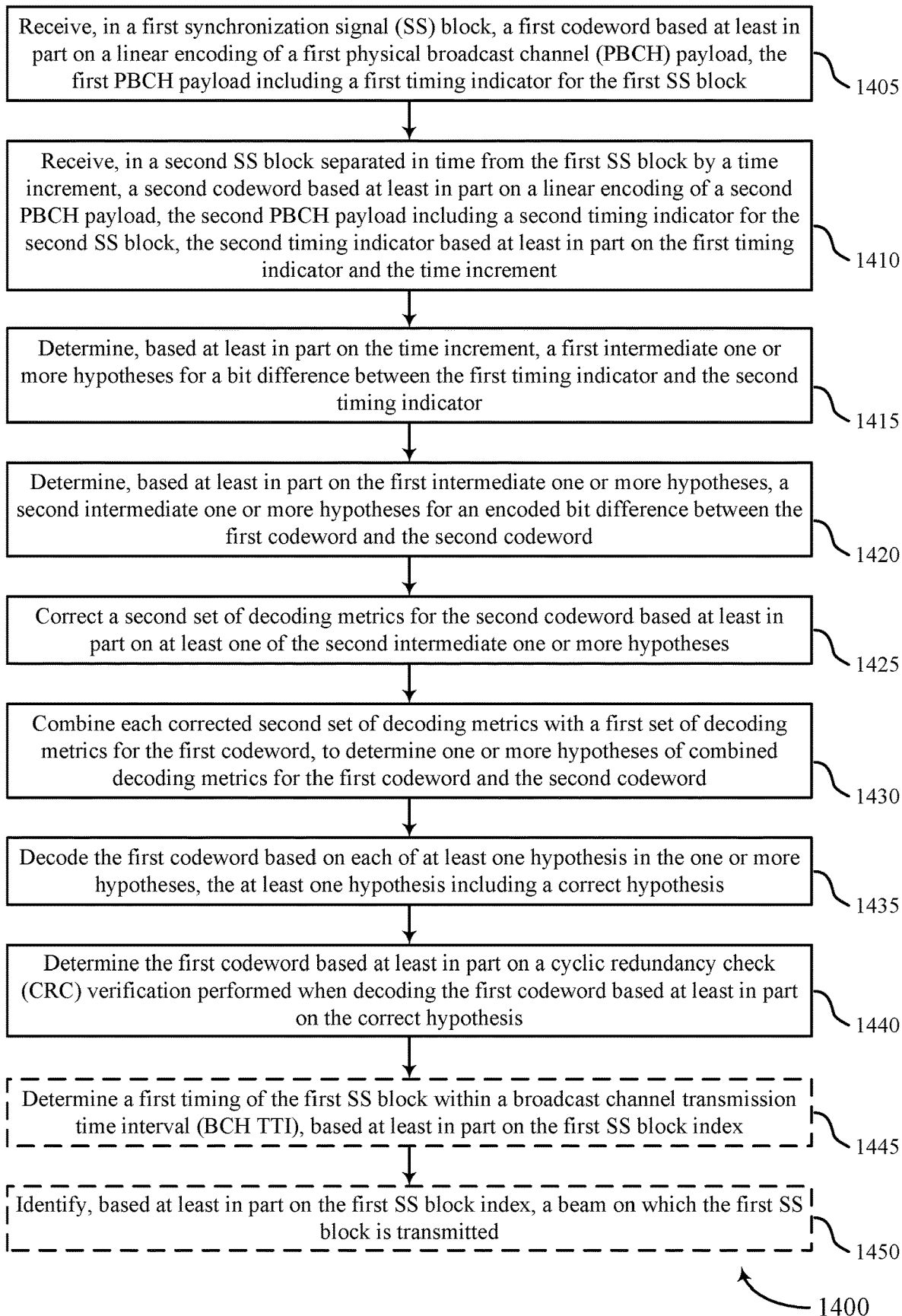

FIG. 14 is a flow chart illustrating an example of a method 1400 for wireless communication at a UE, in accordance with various aspects of the present disclosure. For clarity, the method 1400 is described below with reference to aspects of one or more of the UEs described with reference to FIGS. 1, 3, and 10, aspects of the apparatus described with reference to FIG. 6, or aspects of one or more of the UE wireless communication managers described with reference to FIGS. 6, 7, and 10. In some examples, a UE may execute one or more sets of codes to control the functional elements of the UE to perform the functions described below. Additionally or alternatively, the UE may perform one or more of the functions described below using special-purpose hardware.

At block 1405, the method 1400 may include receiving, in a first SS block, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first codeword may include the first PBCH payload encoded based at least in part on a first linear encoding, with the encoded first PBCH payload and a first CRC for the encoded first PBCH payload encoded based at least in part on a second linear encoding. In some examples, the operation(s) at block 1405 may be performed using the SS block reception manager described with reference to FIGS. 6 and 7.

At block 1410, the method 1400 may include receiving, in a second SS block separated in time from the first SS block by a time increment, a second codeword based at least in part on a linear encoding of a second PBCH payload, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second codeword may include the second PBCH payload encoded based at least in part on the first linear encoding, with the encoded second PBCH payload and a second CRC for the encoded second PBCH payload encoded based at least in part on the second linear encoding. In some examples, the time increment may include a number of SS blocks. In some examples, the operation(s) at block 1410 may be performed using the SS block reception manager described with reference to FIGS. 6 and 7.

Although the order of blocks in the method 1400 imply that the first codeword is received before the second codeword, the first codeword may be received before the second codeword, or the second codeword may be received before the first codeword. The first codeword and the second codeword may each include a same number of bits. In some examples, the first codeword and the second codeword may be from a predetermined set of timing indicators. In some examples, the first PBCH payload and the second PBCH payload may each include a same MIB. In some examples, the first SS block and the second SS block may be received within a BCH TTI. In some examples, the first SS block and the second SS block may be received within different BCH TTIs. In some examples, the first SS block and the second SS block may each include a PSS, a SSS, or a combination thereof.

At blocks 1415, 1420, 1425, and 1430, the method 1400 may include determining, based at least in part on the time increment, one or more hypotheses of combined decoding metrics for the first codeword and the second codeword, as described for example with reference to FIGS. 2-5. At block 1415, the method 1400 may include determining, based at least in part on the time increment, a first intermediate one or more hypotheses for a bit difference between the first timing indicator and the second timing indicator. In some examples, the operation(s) at block 1415 may be performed using the hypothesis manager described with reference to FIGS. 6 and 7, or the bit difference hypothesis manager described with reference to FIG. 7.

At blocks 1420, 1425, and 1430, the method 1400 may include determining the one or more hypotheses of combined decoding metrics for the first codeword and the second codeword based at least in part on the first intermediate one or more hypotheses. At block 1420, the method 1400 may include determining, based at least in part on the first intermediate one or more hypotheses for the bit difference, a second intermediate one or more hypotheses for an encoded bit difference between the first codeword and the second codeword. In some examples, the operation(s) at block 1420 may be performed using the hypothesis manager described with reference to FIGS. 6 and 7, or the encoded bit difference hypothesis manager described with reference to FIG. 7.

At block 1425, the method 1400 may include correcting a second set of decoding metrics for the second codeword based at least in part on at least one of the second intermediate one or more hypotheses. In some examples, the operation(s) at block 1425 may be performed using the decoding metric corrector described with reference to FIG. 7.

At blocks 1430, the method 1400 may include combining each corrected second set of decoding metrics with a first set of decoding metrics for the first codeword, to determine the one or more hypotheses of combined decoding metrics for the first codeword and the second codeword. In some examples, the first set of decoding metrics and second set of decoding metrics may include LLRs. In some examples, the operation(s) at block 1420 may be performed using the hypothesis manager described with reference to FIGS. 6 and 7, or the combined decoding metric hypothesis manager described with reference to FIG. 7.

At block 1435, the method 1400 may include decoding the first codeword based on each of at least one hypothesis in the one or more hypotheses of combined decoding metrics for the first codeword and the second codeword, as described for example with reference to FIGS. 2-5. The at least one hypothesis may include a correct hypothesis. In some examples, the operation(s) at block 1435 may be performed using the decoder described with reference to FIGS. 6 and 7.

At block 1440, the method 1400 may include determining the first codeword based at least in part on a CRC verification performed when decoding the first codeword based at least in part on the correct hypothesis, as described for example with reference to FIGS. 2-5. In some examples, the operation(s) at block 1440 may be performed using the codeword determiner described with reference to FIGS. 6 and 7.

At block 1445, the method 1400 may optionally include determining a first timing of the first SS block within a BCH TTI, based at least in part on the first SS block index, as described for example with reference to FIGS. 2-5. In some examples, the operation(s) at block 1445 may be performed using the timing manager described with reference to FIG. 7.

At block 1450, the method 1400 may optionally include identifying, based at least in part on the first SS block index, a beam on which the first SS block is transmitted, as described for example with reference to FIGS. 2-5. In some examples, the operation(s) at block 1450 may be performed using the beam identifier described with reference to FIG. 7.

Figure 15:
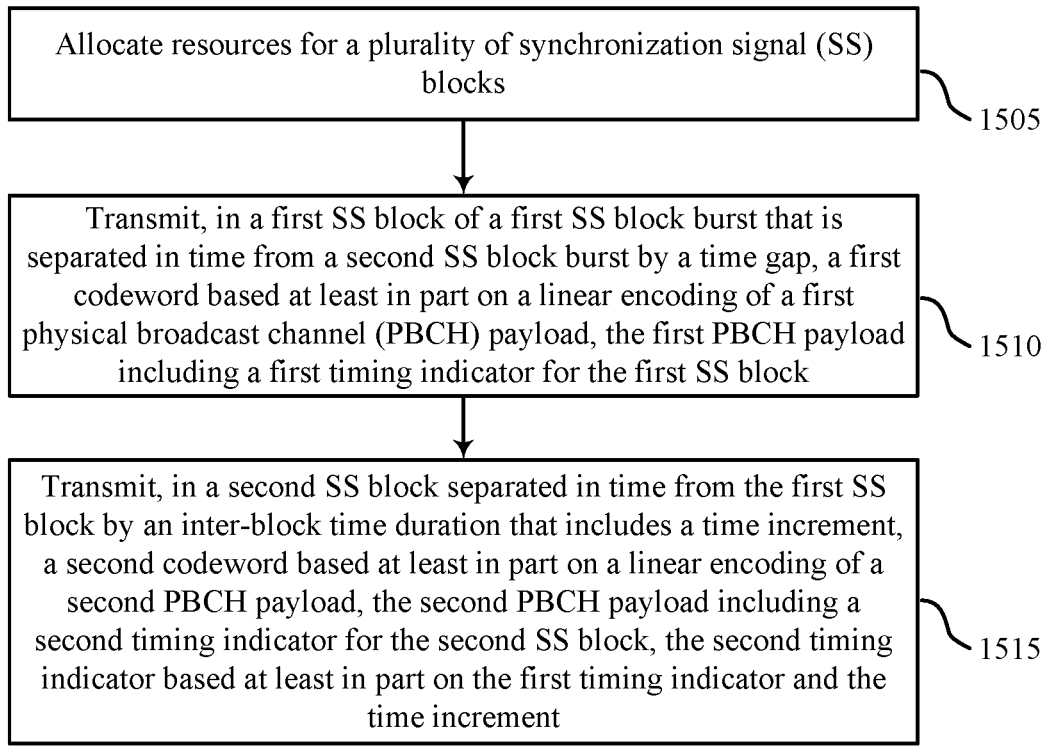
FIGS. 15-16 are flow charts illustrating examples of methods for wireless communication at a base station, in accordance with various aspects of the present disclosure.

FIG. 15 is a flow chart illustrating an example of a method 1500 for wireless communication at a base station, in accordance with various aspects of the present disclosure. For clarity, the method 1500 is described below with reference to aspects of one or more of the base stations described with reference to FIGS. 1, 3, and 11, aspects of the apparatus described with reference to FIG. 8, or aspects of one or more of the base station wireless communication managers described with reference to FIGS. 8, 9, and 11. In some examples, a base station may execute one or more sets of codes to control the functional elements of the base station to perform the functions described below. Additionally or alternatively, the base station may perform one or more of the functions described below using special-purpose hardware.

At block 1505, the method 1500 may include allocating resources for a plurality of SS blocks, as described for example with reference to FIGS. 2-5. In some examples, the resources allocated for the plurality of SS blocks may be within a BCH TTI. In some examples, the resources allocated for the plurality of SS blocks may be within different BCH TTIs. In some examples, the operation(s) at block 1505 may be performed using the resource allocator described with reference to FIGS. 8 and 9.

At block 1510, the method 1500 may include transmitting, in a first SS block of a first SS block burst that is separated in time from a second SS block burst by a time gap, a first codeword based at least in part on a linear encoding of a first PBCH payload, as described for example with reference to FIGS. 2-5. The first PBCH payload may include a first timing indicator for the first SS block. In some examples, the first timing indicator may include a first SS block index, for the first SS block or a portion of the first SS block. In some examples, the first SS block index may identify a first timing of the first SS block within a BCH TTI. In some examples, the first SS block index may identify a first beam on which the first SS block is transmitted. In some examples, the operation(s) at block 1510 may be performed using the codeword transmitter described with reference to FIGS. 8 and 9.

At block 1515, the method 1500 may include transmitting, in a second SS block separated in time from the first SS block by an inter-block time duration that includes a time increment, a second codeword based at least in part on a linear encoding of a second PBCH payload, as described for example with reference to FIGS. 2-5. The second SS block may be transmitted in the first SS block burst, and the inter-block time duration is equal to the time increment. The second SS block may be transmitted in the second SS block burst, and the inter-block time duration includes the time gap. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second SS block index may identify a second timing of the second SS block within the BCH TTI. In some examples, the second SS block index may identify a second beam on which the second SS block is transmitted. In some examples, the time increment may include a number of SS blocks. In some examples, the operation(s) at block 1515 may be performed using the codeword transmitter described with reference to FIGS. 8 and 9.

The first codeword and the second codeword may each include a same number of bits. In some examples, the method 1500 may include selecting the first timing indicator and the second timing indicator from a predetermined set of timing indicators. In some examples, the first PBCH payload and the second PBCH payload may each include a same MIB. In some examples, the first SS block and the second SS block may each include a PSS, a SSS, or a combination thereof.

Figure 16:
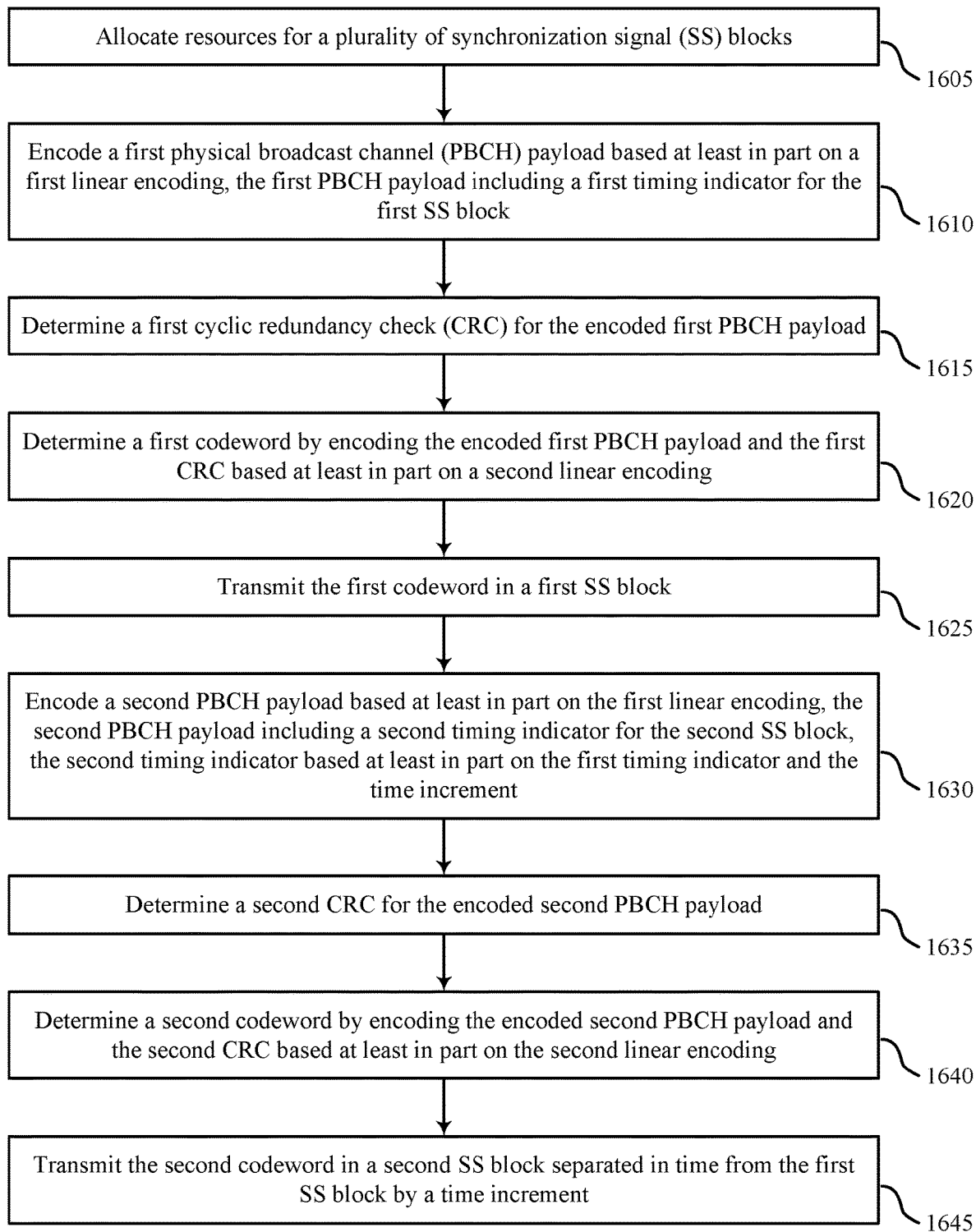

FIG. 16 is a flow chart illustrating an example of a method 1600 for wireless communication at a base station, in accordance with various aspects of the present disclosure. For clarity, the method 1600 is described below with reference to aspects of one or more of the base stations described with reference to FIGS. 1, 3, and 11, aspects of the apparatus described with reference to FIG. 8, or aspects of one or more of the base station wireless communication managers described with reference to FIGS. 8, 9, and 11. In some examples, a base station may execute one or more sets of codes to control the functional elements of the base station to perform the functions described below. Additionally or alternatively, the base station may perform one or more of the functions described below using special-purpose hardware.

At block 1605, the method 1600 may include allocating resources for a plurality of SS blocks, as described for example with reference to FIGS. 2-5. In some examples, the resources allocated for the plurality of SS blocks may be within a BCH TTI. In some examples, the resources allocated for the plurality of SS blocks may be within different BCH TTIs. In some examples, the operation(s) at block 1605 may be performed using the resource allocator described with reference to FIGS. 8 and 9.

At block 1610, the method 1600 may include encoding a first PBCH payload based at least in part on a first linear encoding, as described for example with reference to FIGS. 2-5. The first PBCH payload may include a first timing indicator for the first SS block. In some examples, the first timing indicator may include a first SS block index, for the first SS block or a portion of the first SS block. In some examples, the first SS block index may identify a first timing of the first SS block within a BCH TTI. In some examples, the first SS block index may identify a first beam on which the first SS block is transmitted. In some examples, the operation(s) at block 1610 may be performed using the PBCH payload encoder described with reference to FIG. 9.

At block 1615, the method 1600 may include determining a first CRC for the encoded first PBCH payload, as described for example with reference to FIGS. 2-5. In some examples, the operation(s) at block 1615 may be performed using the CRC determiner described with reference to FIG. 9.

At block 1620, the method 1600 may include determining a first codeword by encoding the encoded first PBCH payload and the first CRC based at least in part on a second linear encoding, as described for example with reference to FIGS. 2-5. In some examples, the operation(s) at block 1620 may be performed using the codeword determiner described with reference to FIG. 9.

At block 1625, the method 1600 may include transmitting the first codeword in a first SS block, as described for example with reference to FIGS. 2-5. In some examples, the operation(s) at block 1625 may be performed using the codeword transmitter described with reference to FIGS. 8 and 9.

At block 1630, the method 1600 may include encoding a second PBCH payload based at least in part on the first linear encoding, as described for example with reference to FIGS. 2-5. The second PBCH payload may include a second timing indicator for the second SS block. The second timing indicator may be based at least in part on the first timing indicator and the time increment. In some examples, the second timing indicator may include a second SS block index, for the second SS block or a portion of the second SS block. In some examples, the second SS block index may identify a second timing of the second SS block within the BCH TTI. In some examples, the second SS block index may identify a second beam on which the second SS block is transmitted. In some examples, the operation(s) at block 1630 may be performed using the PBCH payload encoder described with reference to FIG. 9.

At block 1635, the method 1600 may include determining a second CRC for the encoded second PBCH payload, as described for example with reference to FIGS. 2-5. In some examples, the operation(s) at block 1635 may be performed using the CRC determiner described with reference to FIG. 9.

At block 1640, the method 1600 may include determining a second codeword by encoding the encoded second PBCH payload and the second CRC based at least in part on the second linear encoding, as described for example with reference to FIGS. 2-5. In some examples, the operation(s) at block 1640 may be performed using the resource codeword determiner with reference to FIG. 9.

At block 1645, the method 1600 may include transmitting the second codeword in a second SS block separated in time from the first SS block by a time increment, as described for example with reference to FIGS. 2-5. In some examples, the time increment may include a number of SS blocks. In some examples, the operation(s) at block 1645 may be performed using the codeword transmitter described with reference to FIGS. 8 and 9.

The first codeword and the second codeword may each include a same number of bits, as described for example with reference to FIGS. 2-5. In some examples, the method 1600 may include selecting the first timing indicator and the second timing indicator from a predetermined set of timing indicators. In some examples, the first PBCH payload and the second PBCH payload may each include a same MIB. In some examples, the first SS block and the second SS block may each include a PSS, a SSS, or a combination thereof.

The methods 1200, 1300, 1400, 1500, and 1600 described with reference to FIGS. 12-16 may provide for wireless communication. It should be noted that the methods are example implementations of some of the techniques described in the present disclosure, and the operations of the methods may be rearranged, combined with other operations of the same or different method, or otherwise modified, such that other implementations are possible. In some examples, operations of the methods 1200, 1300, or 1400 may be combined. In some examples, operations of the methods 1500 and 1600 may be combined. In some examples, operations may be added to the methods.

Techniques described herein may be used for various wireless communication systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A may be referred to as CDMA2000 1x, 1x, etc. IS-856 (TIA-856) may be referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP LTE and LTE-A are new releases of UMTS that use E-UTRA. UTRA, E-UTRA, UMTS, LTE, LTE-A, and GSM are described in documents from an organization named 3GPP. CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over an unlicensed or shared bandwidth. The description above, however, describes an LTE/LTE-A system for purposes of example, and LTE terminology is used in much of the description above, although the techniques are applicable beyond LTE/LTE-A applications.

The detailed description set forth above in connection with the appended drawings describes examples and does not represent all of the examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Components implementing functions may also be physically located at various positions, including being distributed such that portions of functions are implemented at different physical locations. As used herein, including in the claims, the term "or," when used in a list of two or more items, means that any one of the listed items can be employed by itself, or any combination of two or more of the listed items can be employed. For example, if a composition is described as containing components A, B, or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can include RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel techniques disclosed herein.

What is claimed is:

1. A method for wireless communication at a user equipment (UE), comprising:
   receiving, in a first synchronization signal (SS) block, a first codeword based at least in part on a linear encoding of a first physical broadcast channel (PBCH) payload, the first PBCH payload including a first timing indicator for the first SS block;
   receiving, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment;
   determining, based at least in part on the time increment and a time gap between two consecutive SS block bursts that is different than the time increment, one or more hypotheses of combined decoding metrics for the first codeword and the second codeword;
   decoding the first codeword based on each of at least one hypothesis in the one or more hypotheses, the at least one hypothesis including a correct hypothesis; and
   determining the first codeword based at least in part on a cyclic redundancy check (CRC) verification performed when decoding the first codeword based at least in part on the correct hypothesis.

2. The method of claim 1, wherein determining the one or more hypotheses comprises:
   determining, based at least in part on the time increment, a first intermediate one or more hypotheses for a bit difference between the first timing indicator and the second timing indicator; and
   determining the one or more hypotheses of combined decoding metrics for the first codeword and the second codeword based at least in part on the first intermediate one or more hypotheses.

3. The method of claim 2, wherein determining the one or more hypotheses of combined decoding metrics for the first codeword and the second codeword based at least in part on the first intermediate one or more hypotheses comprises:
   determining, based at least in part on the first intermediate one or more hypotheses, a second intermediate one or more hypotheses for an encoded bit difference between the first codeword and the second codeword;
   correcting a second set of decoding metrics for the second codeword based at least in part on at least one of the second intermediate one or more hypotheses; and
   combining each corrected second set of decoding metrics with a first set of decoding metrics for the first codeword, to determine the one or more hypotheses of combined decoding metrics for the first codeword and the second codeword.

4. The method of claim 1, wherein the combined decoding metrics comprise log-likelihood ratios (LLRs).

5. The method of claim 1, wherein the first timing indicator comprises a first SS block index, for the first SS block or a portion of the first SS block index, and the second timing indicator comprises a second SS block index, for the second SS block or a portion of the second SS block index.

6. The method of claim 5, further comprising:
determining a first timing of the first SS block within a broadcast channel transmission time interval (BCH TTI), based at least in part on the first SS block index.

7. The method of claim 5, further comprising:
identifying, based at least in part on the first SS block index, a beam on which the first SS block is transmitted.

8. The method of claim 1, wherein:
the first codeword comprises the first PBCH payload encoded based at least in part on a first linear encoding, with the encoded first PBCH payload and a first cyclic redundancy check (CRC) for the encoded first PBCH payload encoded based at least in part on a second linear encoding; and
the second codeword comprises the second PBCH payload encoded based at least in part on the first linear encoding, with the encoded second PBCH payload and a second CRC for the encoded second PBCH payload encoded based at least in part on the second linear encoding.

9. The method of claim 1, wherein the first codeword is received before the second codeword.

10. The method of claim 1, wherein the second codeword is received before the first codeword.

11. The method of claim 1, wherein the first timing indicator and the second timing indicator each comprise a same number of bits.

12. The method of claim 1, wherein the first timing indicator and the second timing indicator are from a predetermined set of timing indicators.

13. The method of claim 1, wherein the time increment comprises a number of SS blocks.

14. The method of claim 1, wherein the first PBCH payload and the second PBCH payload each include a same master information block (MIB).

15. The method of claim 1, wherein the first SS block and the second SS block are received within a broadcast channel transmission time interval (BCH TTI).

16. The method of claim 1, wherein the first SS block and the second SS block are received within different broadcast channel transmission time intervals (BCH TTIs).

17. The method of claim 1, wherein the first SS block and the second SS block each comprise: a primary synchronization signal (PSS), a secondary synchronization signal (SSS), or a combination thereof.

18. An apparatus for wireless communication at a user equipment (UE), comprising:
a processor;
memory in electronic communication with the processor; and
instructions stored in the memory, the instructions being executable by the processor to:
receive, in a first synchronization signal (SS) block, a first codeword based at least in part on a linear encoding of a first physical broadcast channel (PBCH) payload, the first PBCH payload including a first timing indicator for the first SS block;
receive, in a second SS block separated in time from the first SS block by a time increment, a second codeword based at least in part on a linear encoding of a second PBCH payload, the second PBCH payload including a second timing indicator for the second SS block, the second timing indicator based at least in part on the first timing indicator and the time increment;
determine, based at least in part on the time increment and a time gap between two consecutive SS block bursts that is different than the time increment, one or more hypotheses of combined decoding metrics for the first codeword and the second codeword;
decode the first codeword based on each of at least one hypothesis in the one or more hypotheses, the at least one hypothesis including a correct hypothesis; and
determine the first codeword based at least in part on a cyclic redundancy check (CRC) verification performed when decoding the first codeword based at least in part on the correct hypothesis.

19. The apparatus of claim 18, wherein the instructions to determine the one or more hypotheses are executable by the processor to:
determine, based at least in part on the time increment, a first intermediate one or more hypotheses for a bit difference between the first timing indicator and the second timing indicator; and
determine the one or more hypotheses of combined decoding metrics for the first codeword and the second codeword based at least in part on the first intermediate one or more hypotheses.

20. The apparatus of claim 19, wherein the instructions to determine the one or more hypotheses of combined decoding metrics for the first codeword and the second codeword based at least in part on the first intermediate one or more hypotheses are executable by the processor to:
determine, based at least in part on the first intermediate one or more hypotheses, a second intermediate one or more hypotheses for an encoded bit difference between the first codeword and the second codeword;
correct a second set of decoding metrics for the second codeword based at least in part on at least one of the second intermediate one or more hypotheses; and
combine each corrected second set of decoding metrics with a first set of decoding metrics for the first codeword, to determine the one or more hypotheses of combined decoding metrics for the first codeword and the second codeword.

21. The apparatus of claim 18, wherein the combined decoding metrics comprise log-likelihood ratios (LLRs).

22. The apparatus of claim 18, wherein the first timing indicator comprises a first SS block index, for the first SS block or a portion of the first SS block index, and the second timing indicator comprises a second SS block index, for the second SS block or a portion of the second SS block index.

23. The apparatus of claim 22, wherein the instructions are executable by the processor to:
determine a first timing of the first SS block within a broadcast channel transmission time interval (BCH TTI), based at least in part on the first SS block index.

24. The apparatus of claim 22, wherein the instructions are executable by the processor to:
identify, based at least in part on the first SS block index, a beam on which the first SS block is transmitted.

25. The apparatus of claim 18, wherein:
the first codeword comprises the first PBCH payload encoded based at least in part on a first linear encoding, with the encoded first PBCH payload and a first cyclic redundancy check (CRC) for the encoded first PBCH payload encoded based at least in part on a second linear encoding; and
the second codeword comprises the second PBCH payload encoded based at least in part on the first linear encoding, with the encoded second PBCH payload and a second CRC for the encoded second PBCH payload encoded based at least in part on the second linear encoding.

26. The apparatus of claim 18, wherein the first codeword is received before the second codeword.

27. The apparatus of claim 18, wherein the second codeword is received before the first codeword.

28. The apparatus of claim 18, wherein the first timing indicator and the second timing indicator each comprise a same number of bits.

29. The apparatus of claim 18, wherein the first timing indicator and the second timing indicator are from a predetermined set of timing indicators.

30. The apparatus of claim 18, wherein the time increment comprises a number of SS blocks.

31. The apparatus of claim 18, wherein the first PBCH payload and the second PBCH payload each include a same master information block (MIB).

32. The apparatus of claim 18, wherein the first SS block and the second SS block are received within a broadcast channel transmission time interval (BCH TTI).

33. The apparatus of claim 18, wherein the first SS block and the second SS block are received within different broadcast channel transmission time intervals (BCH TTIs).

34. The apparatus of claim 18, wherein the first SS block and the second SS block each comprise: a primary synchronization signal (PSS), a secondary synchronization signal (SSS), or a combination thereof.

35. A method for wireless communication at a base station, comprising:
    allocating resources for a plurality of synchronization signal (SS) blocks;
    transmitting, in a first SS block of a first SS block burst that is separated in time from a second SS block burst by a time gap, a first codeword based at least in part on a linear encoding of a first physical broadcast channel (PBCH) payload, the first PBCH payload including a first timing indicator for the first SS block; and
    transmitting, in a second SS block separated in time from the first SS block by an inter-block time duration that includes a time increment, a second codeword based at least in part on a linear encoding of a second PBCH payload, the second PBCH payload including a second timing indicator for the second SS block that is based at least in part on the first timing indicator and the time increment, wherein a last SS block of the first SS block burst and a leading SS block of the second SS block burst have consecutive SS block indices and are separated by a temporal spacing that exceeds a temporal spacing between a pair of SS blocks with consecutive SS block indices in the first or second SS block bursts.

36. The method of claim 35, wherein the second SS block is transmitted in the first SS block burst, and wherein the inter-block time duration is equal to the time increment.

37. The method of claim 35, wherein the second SS block is transmitted in the second SS block burst, and wherein the inter-block time duration includes the time gap.

38. The method of claim 35, further comprising:
    transmitting, in a third SS block, a third codeword based at least in part on a linear encoding of a third PBCH payload, wherein the third SS block is not separated in time from any other SS block by the inter-block time duration.

39. The method of claim 35, wherein the first timing indicator comprises a first SS block index, for the first SS block or a portion of the first SS block index, and the second timing indicator comprises a second SS block index, for the second SS block or a portion of the second SS block index.

40. The method of claim 39, wherein the first SS block index identifies a first timing of the first SS block within a broadcast channel transmission time interval (BCH TTI), and the second SS block index identifies a second timing of the second SS block within the BCH TTI.

41. The method of claim 39, wherein the first SS block index identifies a first beam on which the first SS block is transmitted, and the second SS block index identifies a second beam on which the second SS block is transmitted.

42. The method of claim 35, further comprising:
    encoding the first PBCH payload based at least in part on a first linear encoding;
    determining a first cyclic redundancy check (CRC) for the encoded first PBCH payload;
    determining the first codeword by encoding the encoded first PBCH payload and the first CRC based at least in part on a second linear encoding;
    encoding the second PBCH payload based at least in part on the first linear encoding;
    determining a second CRC for the encoded second PBCH payload; and
    determining the second codeword by encoding the encoded second PBCH payload and the second CRC based at least in part on the second linear encoding.

43. The method of claim 35, wherein the first timing indicator and the second timing indicator each comprise a same number of bits.

44. The method of claim 35, further comprising:
    selecting the first timing indicator and the second timing indicator from a predetermined set of timing indicators.

45. The method of claim 35, wherein the time increment comprises a number of SS blocks.

46. The method of claim 35, wherein the first PBCH payload and the second PBCH payload each include a same master information block (MIB).

47. The method of claim 35, wherein the resources allocated for the plurality of SS blocks are within a broadcast channel transmission time interval (BCH TTI).

48. The method of claim 35, wherein the resources allocated for the plurality of SS blocks are within different broadcast channel transmission time intervals (BCH TTIs).

49. The method of claim 35, wherein the first SS block and the second SS block each comprise: a primary synchronization signal (PSS), a secondary synchronization signal (SSS), or a combination thereof.

50. An apparatus for wireless communication at a base station, comprising:
    a processor;
    memory in electronic communication with the processor; and
    instructions stored in the memory, the instructions being executable by the processor to:
        allocate resources for a plurality of synchronization signal (SS) blocks;
        transmit, in a first SS block of a first SS block burst that is separated in time from a second SS block burst by a time gap, a first codeword based at least in part on a linear encoding of a first physical broadcast channel (PBCH) payload, the first PBCH payload including a first timing indicator for the first SS block; and
        transmit, in a second SS block separated in time from the first SS block by an inter-block time duration that includes a time increment, a second codeword based at least in part on a linear encoding of a second PBCH payload, the second PBCH payload including a second timing indicator for the second SS block that is based at least in part on the first timing indicator and the time increment, wherein a last SS block of the first SS block burst and a leading SS block of the second SS block burst have consecutive SS block indices and are separated by a temporal spacing that exceeds a temporal spacing between a pair of SS blocks with consecutive SS block indices in the first or second SS block bursts.

51. The apparatus of claim 50, wherein the second SS block is transmitted in the first SS block burst, and wherein the inter-block time duration is equal to the time increment.

52. The apparatus of claim 50, wherein the second SS block is transmitted in the second SS block burst, and wherein the inter-block time duration includes the time gap.

53. The apparatus of claim 50, wherein the instructions are executable by the processor to:
  transmit, in a third SS block, a third codeword based at least in part on a linear encoding of a third PBCH payload, wherein the third SS block is not separated in time from any other SS block by the inter-block time duration.

54. The apparatus of claim 50, wherein the first timing indicator comprises a first SS block index, for the first SS block or a portion of the first SS block index, and the second timing indicator comprises a second SS block index, for the second SS block or a portion of the second SS block index.

55. The apparatus of claim 54, wherein the first SS block index identifies a first timing of the first SS block within a broadcast channel transmission time interval (BCH TTI), and the second SS block index identifies a second timing of the second SS block within the BCH TTI.

56. The apparatus of claim 54, wherein the first SS block index identifies a first beam on which the first SS block is transmitted, and the second SS block index identifies a second beam on which the second SS block is transmitted.

57. The apparatus of claim 50, wherein the instructions are executable by the processor to:
  encode the first PBCH payload based at least in part on a first linear encoding;
  determine a first cyclic redundancy check (CRC) for the encoded first PBCH payload;
  determine the first codeword by encoding the encoded first PBCH payload and the first CRC based at least in part on a second linear encoding;
  encode the second PBCH payload based at least in part on the first linear encoding;
  determine a second CRC for the encoded second PBCH payload; and
  determine the second codeword by encoding the encoded second PBCH payload and the second CRC based at least in part on the second linear encoding.

58. The apparatus of claim 50, wherein the first timing indicator and the second timing indicator each comprise a same number of bits.

59. The apparatus of claim 50, wherein the instructions are executable by the processor to:
  select the first timing indicator and the second timing indicator from a predetermined set of timing indicators.

60. The apparatus of claim 50, wherein the time increment comprises a number of SS blocks.

* * * * *